United States Patent
Deng et al.

(10) Patent No.: US 9,455,021 B2
(45) Date of Patent: Sep. 27, 2016

(54) ARRAY POWER SUPPLY-BASED SCREENING OF STATIC RANDOM ACCESS MEMORY CELLS FOR BIAS TEMPERATURE INSTABILITY

(75) Inventors: Xiaowei Deng, Plano, TX (US); Wah Kit Loh, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1144 days.

(21) Appl. No.: 13/440,769

(22) Filed: Apr. 5, 2012

(65) Prior Publication Data

US 2013/0021864 A1 Jan. 24, 2013

Related U.S. Application Data

(60) Provisional application No. 61/510,788, filed on Jul. 22, 2011.

(51) Int. Cl.

| G11C 11/417 | (2006.01) |
|---|---|
| G11C 11/41 | (2006.01) |
| G11C 11/419 | (2006.01) |
| G11C 29/00 | (2006.01) |
| G11C 29/08 | (2006.01) |
| G11C 29/50 | (2006.01) |

(52) U.S. Cl.
CPC ............ *G11C 11/417* (2013.01); *G11C 11/419* (2013.01); *G11C 29/00* (2013.01); *G11C 29/08* (2013.01); *G11C 29/50* (2013.01); *G11C 11/41* (2013.01); *G11C 2029/5002* (2013.01)

(58) Field of Classification Search
CPC ... G11C 11/417; G11C 11/419; G11C 11/41; G11C 29/00; G11C 29/08; G11C 29/50; G11C 2029/5002
USPC .................... 365/201, 154, 190, 189.05, 226
See application file for complete search history.

(56) References Cited

U.S. PATENT DOCUMENTS 7,391,232 B1 * 6/2008 Bose .................... G06F 1/3203
326/33
8,503,221 B1 * 8/2013 Hobson ................ G11C 11/412
365/154

(Continued)

OTHER PUBLICATIONS

U.S. Appl. No. 13/146,7517, filed May 9, 2012, entitled, "Method of Screening Static Random Access Memory Cells for Positive Bias Temperature Instability".

(Continued)

*Primary Examiner* — Vu Le
*Assistant Examiner* — Sung Cho
(74) *Attorney, Agent, or Firm* — Rose Alyssa Keagy; Frank D. Cimino

(57) ABSTRACT

A method of screening complementary metal-oxide-semiconductor CMOS integrated circuits, such as integrated circuits including CMOS static random access memory (SRAM) cells, for transistors susceptible to transistor characteristic shifts over operating time. For the example of SRAM cells formed of cross-coupled CMOS inverters, separate ground voltage levels can be applied to the source nodes of the driver transistors, or separate power supply voltage levels can be applied to the source nodes of the load transistors (or both). Asymmetric bias voltages applied to the transistors in this manner will reduce the transistor drive current, and can thus mimic the effects of bias temperature instability (BTI). Cells that are vulnerable to threshold voltage shift over time can thus be identified.

12 Claims, 11 Drawing Sheets

(56) References Cited

U.S. PATENT DOCUMENTS

| | | | | |
|---|---|---|---|---|
| 2006/0256605 | A1* | 11/2006 | Joshi | G11C 11/417 365/100 |
| 2007/0002617 | A1* | 1/2007 | Houston | G11C 11/412 365/185.07 |
| 2007/0058466 | A1* | 3/2007 | Joshi | G11C 29/006 365/201 |
| 2007/0133326 | A1* | 6/2007 | Ishikura | G11C 29/12005 365/201 |
| 2007/0139997 | A1* | 6/2007 | Suzuki | G11C 5/14 365/154 |
| 2008/0144421 | A1* | 6/2008 | Deng | G11C 11/412 365/230.05 |
| 2008/0219069 | A1* | 9/2008 | Arsovski | G11C 29/50 365/201 |
| 2008/0238437 | A1* | 10/2008 | Foeste | G11C 29/12005 324/522 |
| 2010/0329062 | A1* | 12/2010 | Campbell | G11C 7/04 365/226 |
| 2011/0103126 | A1* | 5/2011 | Satomi et al. | 365/72 |
| 2011/0103216 | A1* | 5/2011 | Knittel | B82Y 10/00 369/112.07 |
| 2011/0280094 | A1* | 11/2011 | Heymann | G11C 11/413 365/226 |
| 2012/0008449 | A1* | 1/2012 | Chuang | G11C 11/417 365/227 |

OTHER PUBLICATIONS

U.S. Appl. No. 13/189,675, filed Jul. 25, 2011, entitled "Method of Screening Static Random Access Memories for Unstable Memory Cells".

Mistry et al., "A 45nm Logic Technology with High-k+Metal Gate Transistors, Strained Silicon, 9 Cu Interconnect Layers, 193nm Dry Patterning, and 100% Pb-free Packaging", IEEE Int'l Electron Devices Meeting (IEEE 2007), pp. 247-250.

Meixner et al., "Weak Write Test Mode: An SRAM Cell Stability Design for Test Technique", Proceedings of the Int'l Test Conference (IEEE, 1997), pp. 1043-1052.

Kerber et al., "Characterization of the Vt-Instability in SiO2/HFO2 Gate Dielectrics", IEEE Int'l Reliability Physics Symposium Proceedings (IEEE 2003), pp. 41-45.

Kalpat et al., "BTI Characteristics and Mechanisms of Metal Gated HfO2 Films with Enhanced Interface/Bulk Process Treatments", Trans. on Device and Materials Reliability, vol. 5, No. 1 (IEEE, 2005), pp. 26-35.

* cited by examiner

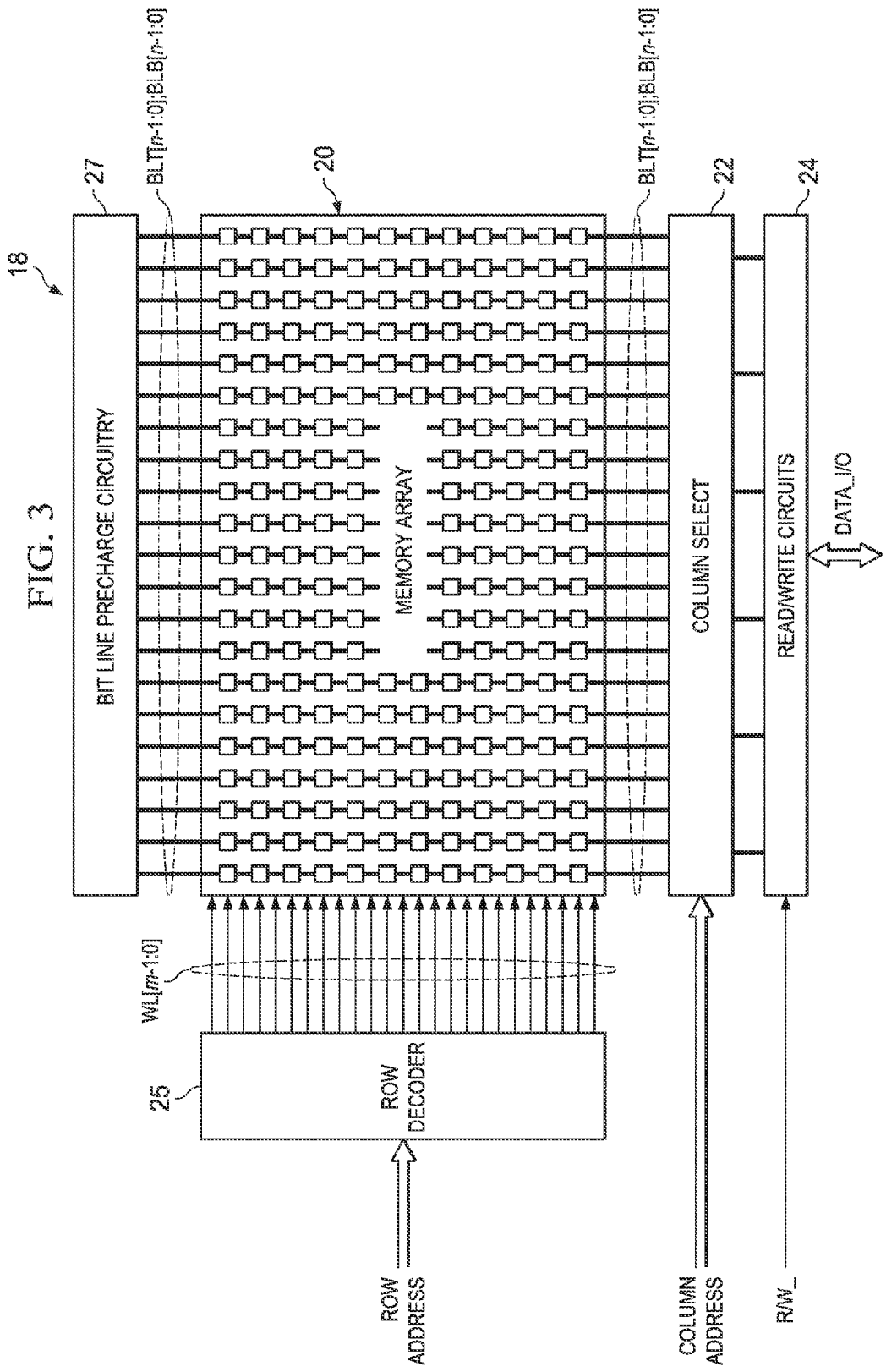

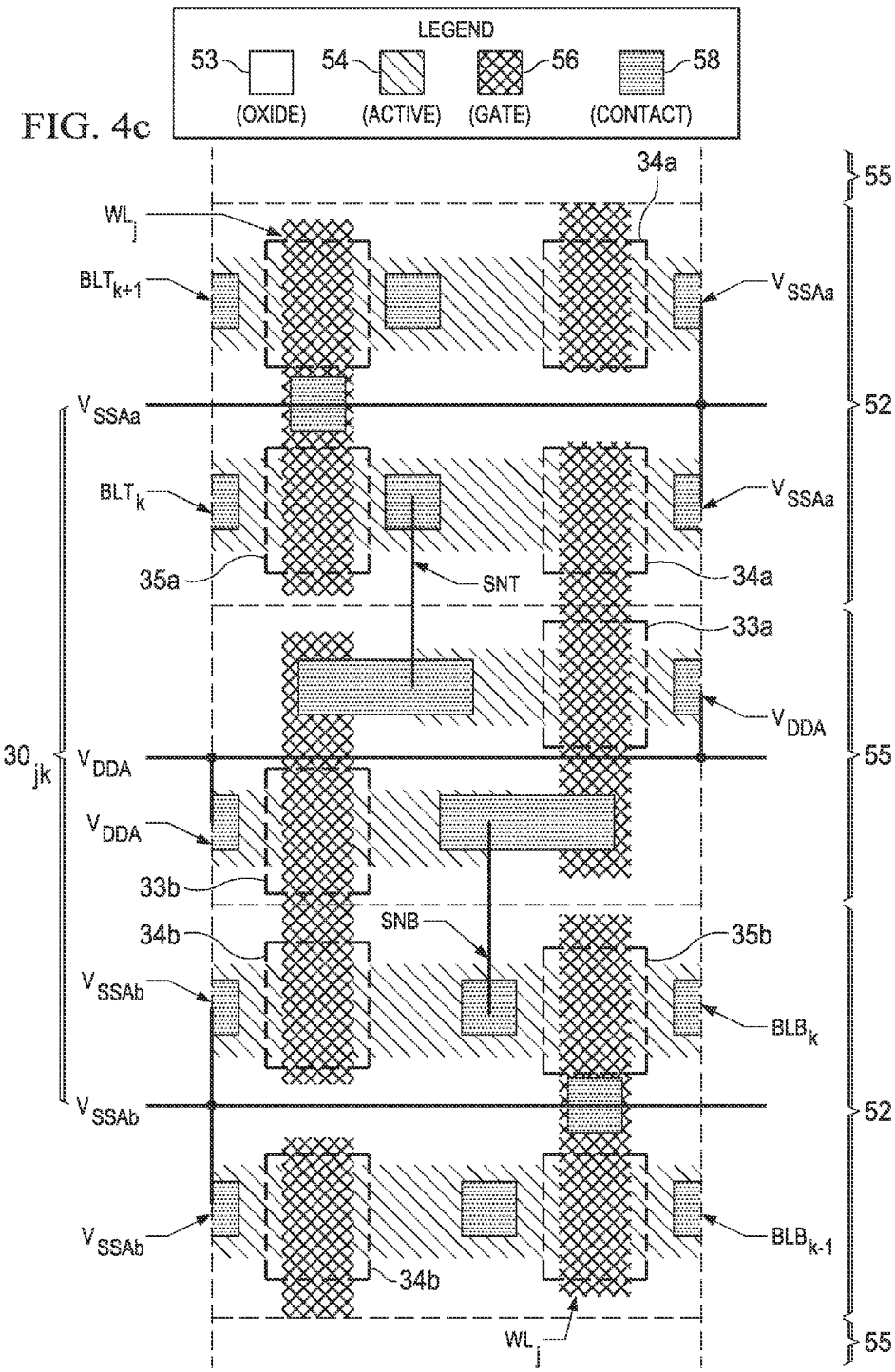

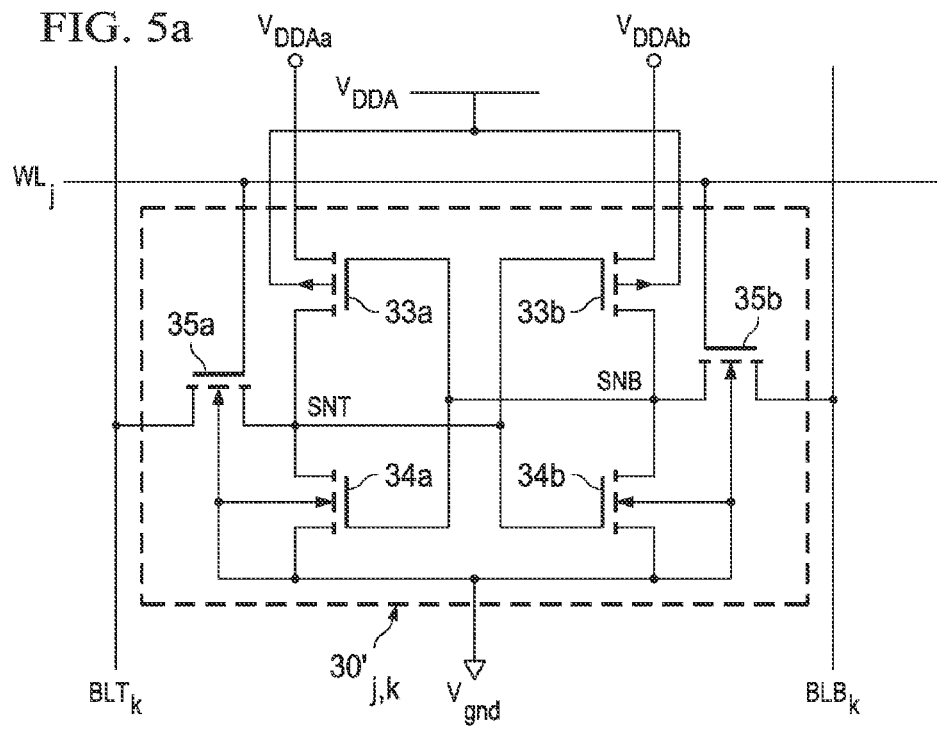
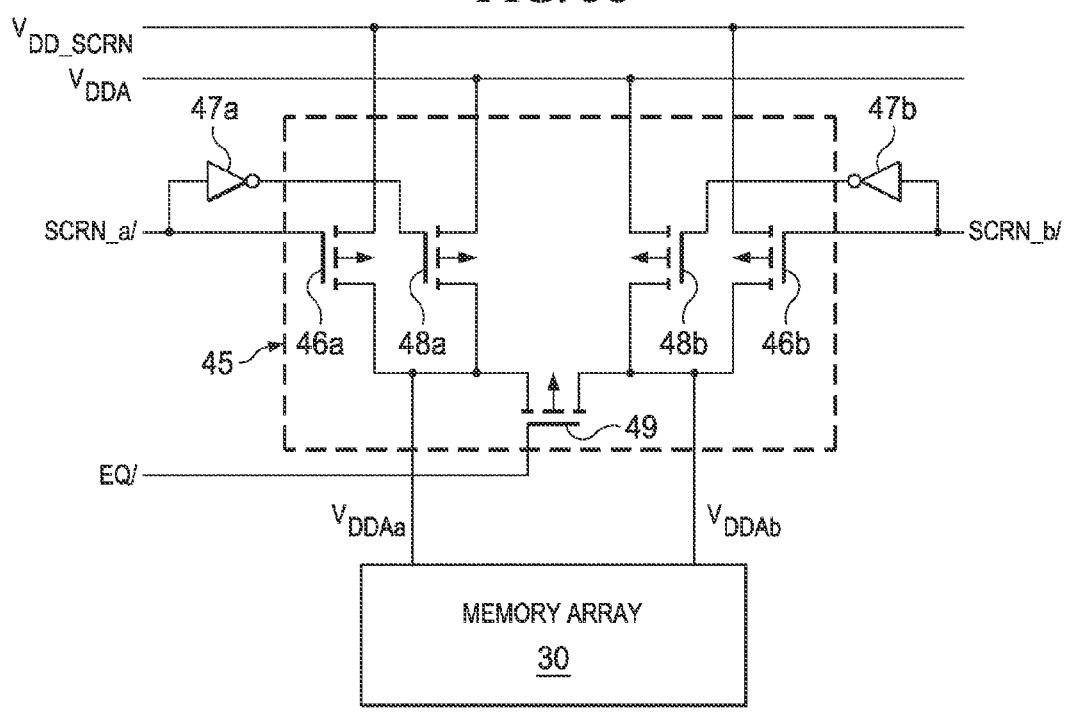

ARRAY POWER SUPPLY-BASED SCREENING OF STATIC RANDOM ACCESS MEMORY CELLS FOR BIAS TEMPERATURE INSTABILITY

CROSS-REFERENCE TO RELATED APPLICATIONS

This application claims priority, under 35 U.S.C. §119(e), of Provisional Application No. 61/510,788, filed Jul. 22, 2011, which is incorporated herein by this reference.

STATEMENT REGARDING FEDERALLY SPONSORED RESEARCH OR DEVELOPMENT

Not applicable.

BACKGROUND OF THE INVENTION

This invention is in the field of solid-state memory. Embodiments of this invention are more specifically directed to the manufacture and testing of static random access memories (SRAMs).

Many modern electronic devices and systems now include substantial computational capability for controlling and managing a wide range of functions and useful applications. Considering the large amount of digital data often involved in performing the complex functions of these modern devices, significant solid-state memory capacity is now commonly implemented in the electronic circuitry for these systems. Static random access memory (SRAM) has become the memory technology of choice for much of the solid-state data storage requirements in these modern power-conscious electronic systems. As is fundamental in the art, SRAM cells store contents "statically", in that the stored data state remains latched in each cell so long as power is applied to the memory; this is in contrast to "dynamic" RAM ("DRAM"), in which the data must be periodically refreshed in order to be retained.

Advances in semiconductor technology in recent years have enabled the shrinking of minimum device feature sizes (e.g., MOS transistor gates) into the sub-micron range. This miniaturization is especially beneficial when applied to memory arrays, because of the large proportion of the overall chip area often devoted to on-chip memories. As a result, significant memory resources are now often integrated as embedded memory into larger-scale integrated circuits, such as microprocessors, digital signal processors, and "system-on-a-chip" integrated circuits. However, this physical scaling of device sizes raises significant issues, especially in connection with embedded SRAM but also in SRAM realized as "stand-alone" memory integrated circuit devices. Several of these issues are due to increased variability in the electrical characteristics of transistors formed at these extremely small feature sizes. This variability in characteristics has been observed to increase the likelihood of read and write functional failures, on a cell-by-cell basis. Sensitivity to device variability is especially high in those memories that are at or near their circuit design limits. The combination of increased device variability with the larger number of memory cells (and thus transistors) within an integrated circuit renders a high likelihood that one or more cells cannot be read or written as expected.

Bias temperature instability (BTI) transistor degradation mechanisms have recently become observable at the extremely small minimum feature sizes in modern integrated circuits. One such mechanism is negative bias temperature instability ("NBTI"), which appears as an increase in threshold voltage over time, primarily in p-channel MOS transistors. The physical mechanism underlying NBTI is the trapping of charge at the gate dielectric interface that occurs over time in p-channel MOS transistors that are biased to an "on" state (i.e., a negative voltage at the transistor gate relative to its channel region). Conversely, positive bias-temperature instability ("PBTI") is a similar degradation effect that primarily affects n-channel MOS transistors biased to an "on" state (i.e., a positive voltage at the transistor gate relative to its channel region). For MOS transistors with silicon dioxide gate dielectrics, only slight PBTI degradation of re-channel transistors has been observed in comparison to NBTI degradation of p-channel transistors in the same circuits.

Recently, however, the continuing demand for ever-smaller device geometries has led to the more widespread use of high-k gate dielectric films (i.e., gate dielectric materials with a high dielectric constant relative to that of silicon dioxide). These high-k gate dielectric films, which enable the formation of thicker gate dielectrics with excellent gate characteristics, are typically used in conjunction with metal gate electrodes, rather than polysilicon gates, due to such effects as polysilicon depletion. A common high-k dielectric film used in the art is hafnium oxide ($HfO_2$). Examples of the metal gate material in modern device technologies include titanium nitride (TiN), tantalum-silicon-nitride ($Ta_xSi_yN$), and tantalum carbide ($TaC_x$). These high-k metal gate n-channel MOS transistors have been observed to be vulnerable to threshold voltage shifts due to PBTI, even though their conventional gate dielectric n-channel devices are not. This vulnerability is believed due to the affinity of $HfO_2$ films to trap electrons under positive gate bias (relative to the transistor channel region). As in the case of NBTI, the effect of PBTI on high-k metal gate n-channel MOS transistors is an increase in threshold voltage over time.

In the context of CMOS SRAMs, BTI degradation affects the ability of memory cells to retain data, and to be written and read. These degradation effects will be described in connection with an example of a conventional SRAM cell as shown in FIG. 1. In this example, SRAM cell 2 is a conventional six-transistor (6-T) static memory cell 2, which in this case is in the $j^{th}$ row and $k^{th}$ column of a memory array. SRAM memory cell 2 is biased between the voltage on power supply line $V_{dda}$ and a ground reference voltage $V_{ssa}$. SRAM memory cell 2 is constructed in the conventional manner as a pair of cross-coupled CMOS inverters, one inverter of series-connected p-channel load transistor 3a and n-channel driver transistor 4a, and the other inverter of series-connected p-channel load transistor 3b and n-channel transistor 4b; the gates of the transistors in each inverter are connected together and to the common drain node of the transistors in the other inverter, in the usual manner. The common drain node of transistors 3a, 4a constitutes storage node SNT, and the common drain node of transistors 3b, 4b constitutes storage node SNB, in this example. N-channel pass-gate transistor 5a has its source/drain path connected between storage node SNT and bit line $BLT_k$ for the $k^{th}$ column, and n-channel pass-gate transistor 5b has its source/drain path connected between storage node SNB and bit line $BLB_k$. The gates of pass-gate transistors 5a, 5b are driven by word line $WL_j$ for this $j^{th}$ row in which cell 2 resides.

In its normal operation, bit lines $BLT_k$, $BLB_k$ are typically precharged by precharge circuitry 7 to a high voltage $V_{ddp}$ (which is at or near power supply voltage $V_{dda}$) and are equalized to that voltage; precharge circuitry 7 then releases bit lines $BLT_k$, $BLB_k$. To access cell 2 for a read operation, word line $WL_j$ is then energized, turning on pass-gate transistors 5a, 5b, and connecting storage nodes SNT, SNB to the then-floating bit lines $BLT_k$, $BLB_k$, respectively. The differential voltage developed on bit lines $BLT_k$, $BLB_k$ is then sensed and amplified by a sense amplifier. In a write operation, typical modern SRAM memories include write circuitry that pulls one of the then-floating bit lines $BLT_k$, $BLB_k$ low (i.e., to a voltage at or near ground voltage $V_{ssa}$), depending on the data state to be written. Upon word line $WL_j$ then being energized, the low level bit line $BLT_k$ or $BLB_k$ will pull down its associated storage node SNT, SNB, causing the cross-coupled inverters of addressed cell 2 to latch in the desired state.

BTI degradation can cause operational failures in SRAM cells that are already vulnerable due to variability and mismatch of sub-micron minimum feature size transistors, and other factors. In the conventional cell of FIG. 1, NBTI can affect p-channel load transistors 3a, 3b, while PBTI affects n-channel driver transistors 4a, 4b and n-channel pass transistors 5a, 5b. Typically, BTI appears at those transistors that are biased "on" for long periods of time, such as transistors 3b, 4a (biased on to retain a "0" data state of storage node SNT low and storage node SNB high) or transistors 3a, 4b (biased on to retain a "1" data state of storage node SNB low and storage node SNT high). While pass transistors 5a, 5b are also vulnerable to PBTI, the duty cycle at which these devices are biased on is much lower than for the inverter transistors. Both NBTI and PBTI are reflected by increases in transistor threshold voltage over operating life, which manifests as cell failures in later operating life.

One type of failure that can be caused by BTI is a read stability failure, also referred to as a "disturb" failure or as insufficient static noise margin, in which noise appearing as an elevated voltage (e.g., 0.2 volts) at the low storage node causes a false change of state of the cell. More specifically, this mechanism occurs in "half-selected" cells (cells in unselected columns of the selected row), upon the pass transistor passing the precharged bit line voltage to the low side storage node. If the low side driver transistor is not able to hold a sufficiently low voltage at the storage node, this noise can be of sufficient magnitude to trip the inverters of the cell. Read stability failures can occur in cases in which the drive of the SRAM cell driver or load transistors is mismatched relative to other transistors in the cell. For the example in which cell 2 of FIG. 1 is storing a "0" state (storage node SNT low and storage node SNB high) and has been storing this state for a long period of time, a positive voltage will have been present at the gate of driver transistor 4a over that time potentially causing a threshold voltage shift due to PBTI. If the threshold voltage of driver transistor 4a has increased due to PBTI, it will have weakened drive relative to its pass transistor 5a, which changes the operating point of the voltage divider of transistors 4a, 5a when transistor 5a is turned on during an access to row j. The voltage at storage node SNT during an access to a cell 2 in row j will thus shift to a higher than optimal voltage. This higher voltage will tend to turn on driver transistor 4b, which would flip the state of cell 2.

Conversely, a long-held "0" data state of cell 2 can cause NBTI degradation at load transistor 3b, increasing its threshold voltage relative to that of load transistor 3a. The resulting degradation in drive strength of load transistor 3b will reduce its ability to hold storage node SNB to a high voltage during a noise event, which also decreases the static noise margin of cell 2 and increases the likelihood of an undesired change of state.

As discussed above, a read of cell 2 is performed by energizing word line $WL_j$ to turn on pass transistors 5a, 5b, and sensing which of precharged bit lines $BLT_k$, $BLB_k$ are pulled down by the driver transistor 4a, 4b current in its "on" state. Similarly, weakening of the drive of one of driver transistors 4a, 4b, and of one of load transistors 3a, 3b, due to PBTI and NBTI, respectively, results in weaker read current during a read cycle. Sufficiently weak read current will, of course, causes an insufficient differential signal to be developed across bit lines $BLT_k$, $BLB_k$, leading to a so-called "read failure" (an incorrect data state being read). Weakened drive in n-channel pass transistors 5a, 5b due to PBTI can exacerbate this weakness in read current.

SRAM cells that exhibit PBTI and NBTI are vulnerable to a similar failure mechanism, referred to in the art as a retention stability failure. This failure is manifest by the cell being unable to retain its stored data state at a reduced power supply voltage level. As known in the art, many SRAM memories are expected to provide the user with a low power "retention mode" in which the power supply voltage applied to the memory array is reduced (during which time the memory is not available for immediate access). The reduced power supply voltage of course reduces the standby power consumed by the memory. As such, the ability of the cells in the memory array to retain their stored data states in retention mode is of importance. Indeed, the retention performance of the weakest cell in the array effectively determines the lowest power supply voltage available in retention mode, and thus the extent to which power consumption can be reduced in this mode. Weakened drive capability due to PBTI in one of the driver transistors, or weakened drive capability due to NBTI on one of the load transistors, contributes to poorer retention capability of an SRAM cell because of the resulting weakness with which the levels at the corresponding storage nodes are held by those devices.

Another failure mechanism that can result from PBTI and NBTI degradation is a write failure, which occurs when an addressed SRAM cell does not change its stored state in response to a write of the opposite data state from that stored. Write failures are the converse of read stability failures—while a read stability failure occurs if a cell changes its state too easily, a write failure occurs if a cell is too stubborn in changing its state, specifically by the write circuitry being unable to pull down the storage node that is currently latched to a high voltage.

For example, if cell 2 of FIG. 1 is storing a "0" data state, a high logic level will be present at storage node SNB. If pass transistor 5b has degraded due to PBTI, its drive current will have weakened and thus will reduce the ability of the low-side bit line $BLB_k$ to overcome the drive of load transistor 3b to write the opposite "1" data state. In addition, if driver transistor 4b has weakened due to PBTI, the effect of feedback from storage node SNT being pulled high by load transistor 3a during this write cycle will be reduced, further reducing the writeability of cell 2. NBTI degradation at load transistor 3a will also be reflected in a potential write failure (i.e., a write from "0" to "1") by reducing its ability to pull storage node SNT high in response to storage node SNB being pulled low by bit line $BLB_k$.

In each case, it is contemplated that the memory cells most vulnerable to the effects of PBTI or NBTI degradation are those cells that already have a device mismatch or other asymmetry in their manufacture. As mentioned above, such mismatches and asymmetries are more pronounced given the increased variability in the electrical characteristics observed for transistors having extremely small feature sizes, particularly in memories that are designed at or near their circuit design limits.

The increased level of reliability required of modern integrated circuits has necessitated the use of time-zero screens to remove (or repair, by way of redundant memory cells and circuit functions) those devices that are vulnerable to failure over the expected operating life of the device. In the sub-micron CMOS SRAM context, manufacturing test flows now commonly include screens to identify or replace those memory cells that are close to a pass/fail threshold at manufacture, within a margin corresponding to the expected PBTI or NBTI drift over the desired operating life. A conventional approach in such screening is to apply "guardbands" on certain applied voltages during functional or parametric tests of circuit functions. In many cases, guardbanded voltages are implemented to account for the temperature dependence of circuit behavior, to enable the manufacturer to perform functional testing at one temperature (preferably room temperature) with confidence that the circuit will perform according to specification over the full specified temperature range, over the expected operating life. As known in the art, it is becoming increasingly difficult to design the appropriate test "vectors" (i.e., combinations of bias and internal circuit voltages, and other test conditions) that identify devices that are vulnerable to failure over time and temperature, without significant yield loss of devices that would not fail over operating life yet fail the screen at the applied guardbanded test vectors.

Copending U.S. application Ser. No. 13/189,675, filed Jul. 25, 2011, commonly assigned herewith and incorporated herein by reference, describes a screening method for testing solid-state memories for the effects of long-term shift due to NBTI in combination with random telegraph noise (RTN), in the context of SRAM cells As described in that application, each memory cell in the array is functionally tested with a bias voltage (e.g., the cell power supply voltage) at a first guardband that is sufficient to account for worst case long-term shift and RTN effects. Cells failing the first guardband test are then repeatedly tested with the bias voltage at a second guardband that is less severe than the first; those previously failed cells that pass this second guardband are considered to not be vulnerable to RTN effects. This approach avoids the over-screening of conventional test methods that apply an unduly severe guardband, while still identifying vulnerable memory cells in the population for repair or as failed devices.

By way of further background, it is known in the art to apply a voltage higher than the power supply voltage to the body nodes of the p-channel load transistors during the test of SRAM arrays. This condition is referred to in the art as a "reverse back-bias" condition, and is typically applied to the n-well regions in which the load transistors are formed. As fundamental in the art, this reverse back-bias voltage has the effect of increasing the threshold voltage of the load transistors, and thus reducing their source-drain drive at a given source-drain voltage and gate-source voltage. Such a test is performed with the intent of screening out cells that are vulnerable to increased threshold voltage over operating time caused by NBTI.

It has been discovered, in connection with this invention, that it is difficult to derive an accurate time-zero screen to identify those memory cells for which NBTI and PBTI degradation will cause read or write failures or read stability failures. To the extent that potential proxies for this effect are available, those proxies necessitate an excessively harsh screen margin (i.e., guardband) to meet modern reliability goals. The undue yield loss of devices that fail such a screen but would, in fact, not have degraded to failure, can be substantial.

BRIEF SUMMARY OF THE INVENTION

Embodiments of this invention provide a solid-state static random access memory (SRAM) and a method of operating the same by way of which memory cells that are susceptible to later-life failure caused by bias temperature instability (BTI) can be identified.

Embodiments of this invention provide such a memory and method that can identify memory cells vulnerable to BTI of either type, namely positive bias temperature instability (PBTI) or negative bias temperature instability (NBTI).

Embodiments of this invention provide such a memory and method that can more directly screen for BTI-susceptible memory cells, rather than by way of an approximation or proxy.

Embodiments of this invention provide such a memory and method that are capable of accurately and efficiently identifying such susceptible memory cells so as to minimize unnecessary yield loss.

Embodiments of this invention provide such a memory and method that can be readily implemented into modern manufacturing technology without requiring a precision photolithography operation.

Embodiments of this invention provide such a memory and method that can incorporate threshold voltage temperature dependence into the screen, avoiding the need to test the memories at temperature.

Embodiments of this invention provide such a memory and method that is suitable for use in connection with high-performance CMOS manufacturing technologies such as high-k gate dielectric materials and metal gate electrodes.

Other objects and advantages of embodiments of this invention will be apparent to those of ordinary skill in the art having reference to the following specification together with its drawings.

Embodiments of this invention may be implemented in connection with a solid-state static random access memory (SRAM) constructed according to complementary metal-oxide-semiconductor (CMOS) technology. The SRAM cells are constructed as cross-coupled CMOS inverters, in which the inverter load and driver transistors have their source/drain paths connected in series between an array power supply voltage and an array ground voltage. According to embodiments of this invention, either or both of the array power supply and array ground voltages applied to the transistors of each inverter is separately controllable relative to that applied to corresponding transistors in the other inverter of the memory cell. Each memory cell is functionally tested by first writing a data state into the memory cell, followed by reducing the bias to a transistor in one of the inverters from that applied to the corresponding transistor in the other inverter. In a CMOS arrangement, the reduced bias may be either an increased ground voltage applied to the source of one of the n-channel driver transistors, or a reduced power supply voltage applied to the source of one of the p-channel load transistors, or both. The cell is then accessed under that asymmetric bias condition. The reduced bias mimics the effect of weakened drive current of a transistor resulting from BTI, allowing evaluation of the vulnerability of the cell to BTI degradation over operating life.

In some embodiments, the memory cells are physically arranged so that adjacent rows or columns can share a bias voltage line, thus minimizing the chip area required for separate bias voltages for the inverters of each cell. Circuitry outside of the memory array is provided to control the application and equalization of the separate bias voltages in test and normal operating conditions.

BRIEF DESCRIPTION OF THE SEVERAL VIEWS OF THE DRAWING

FIG. 3 is an electrical diagram, in block form, of a memory in the integrated circuit of FIG. 2 suitable for testing according to embodiments of this invention.

FIG. 4c is a plan view of a portion of the memory of FIG. 3 including the SRAM cell of FIG. 4a according to that embodiment of the invention.

FIG. 5a is an electrical diagram, in schematic form, of an SRAM cell suitable for testing according to another embodiment of this invention.

FIG. 5b is an electrical diagram, in schematic form, of bias voltage select circuitry used in connection with the SRAM cell of FIG. 5a according to that embodiment of the invention.

DETAILED DESCRIPTION OF THE INVENTION

This invention will be described in connection with certain embodiments, namely as implemented into a method of testing static random access memories, because it is contemplated that this invention will be especially beneficial when used in such an application. However, it is also contemplated that embodiments of this invention will also be beneficial if applied to memories of other types, including read-only memories and electrically programmable read-only memories, among others. Furthermore, it is contemplated that embodiments of this invention may be used to test and screen circuit functions other than memories, including especially digital logic functions. Accordingly, it is to be understood that the following description is provided by way of example only, and is not intended to limit the true scope of this invention as claimed.

Figure 1:
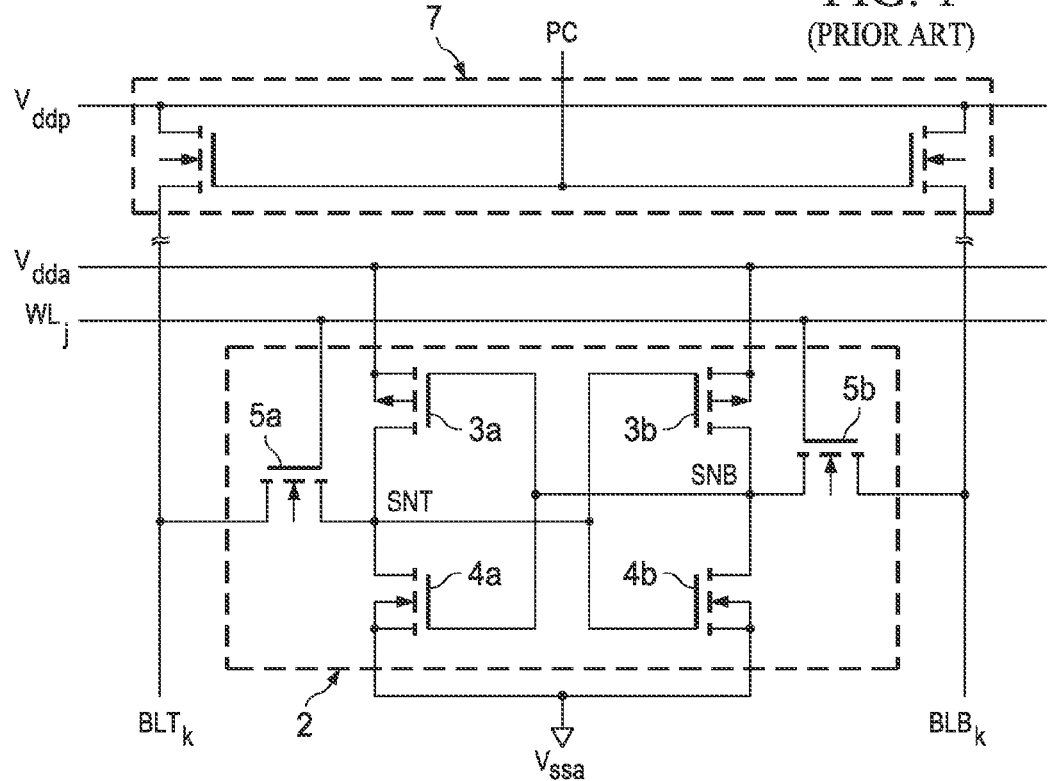
FIG. 1 is an electrical diagram, in schematic form, of a conventional static random access memory (SRAM) cell.
Figure 2:
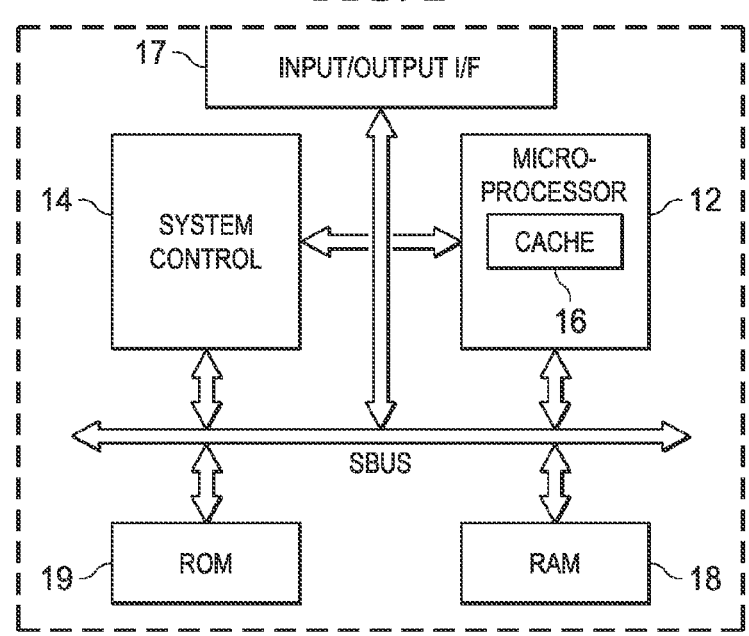
FIG. 2 is an electrical diagram, in block form, of an integrated circuit including one or more memory resources suitable for testing according to embodiments of this invention.

FIG. 2 illustrates an example of large-scale integrated circuit 10, in the form of a so-called "system-on-a-chip" ("SoC"), as now popular in many electronic systems. Integrated circuit 10 is a single-chip integrated circuit into which an entire computer architecture is realized. As such, in this example, integrated circuit 10 includes a central processing unit of microprocessor 12, which is connected to system bus SBUS. Various memory resources, including random access memory (RAM) 18 and read-only memory (ROM) 19, reside on system bus SBUS and are thus accessible to microprocessor 12. In many modern implementations, ROM 19 is realized by way of electrically erasable programmable read-only memory (EEPROM), a common type of which is referred to as "flash" EEPROM. As will be described in further detail below, realization of at least part of ROM 19 as flash EEPROM can facilitate the implementation and operation of embodiments of this invention. In any case, ROM 19 typically serves as program memory, storing the program instructions executable by microprocessor 12, while RAM 18 serves as data memory; in some cases, program instructions may reside in RAM 18 for recall and execution by microprocessor 12. Cache memory 16 (such as level 1, level 2, and level 3 caches, each typically implemented as SRAM) provides another memory resource, and resides within microprocessor 12 itself and therefore does not require bus access. Other system functions are shown, in a generic sense, in integrated circuit 10 by way of system control 14 and input/output interface 17.

Those skilled in the art having reference to this specification will recognize that integrated circuit 10 may include additional or alternative functions to those shown in FIG. 2, or may have its functions arranged according to a different architecture from that shown in FIG. 2. The architecture and functionality of integrated circuit 10 is thus provided only by way of example, and is not intended to limit the scope of this invention.

Further detail in connection with the construction of RAM 18 in integrated circuit 10 is illustrated in FIG. 3. Of course, a similar construction may be used to realize other memory resources such as cache memory 16; further in the alternative, RAM 18 may correspond to a stand-alone memory integrated circuit (i.e., rather than as an embedded memory as shown in FIG. 2). Those skilled in the art having reference to this specification will comprehend that the memory architecture of RAM 18 in FIG. 3 is provided by way of example only.

In this example, RAM 18 includes many memory cells arranged in rows and columns within memory array 20. While a single instance of memory array 20 is shown in FIG. 3, it is to be understood that RAM 18 may include multiple memory arrays 20, each corresponding to a memory block within the address space of RAM 18. In the example shown in FIG. 3, memory array 20 includes m rows and n columns of SRAM cells, with cells in the same column sharing a pair of bit lines BLT[n-1:0], BLB[n-1:0], and with memory cells in the same row sharing one of word lines WL[m-1:0]. Bit line precharge circuitry 27 is provided to apply a desired precharge voltage to the pairs of bit lines BLT[n-1:0], BLB[n-1:0] in advance of read and write operations. Row decoder 25 receives a row address value indicating the row of memory array 20 to be accessed, and energizes the one of word lines WL[m-1:0] corresponding to that row address value. Column select circuit 22 receives a column address value, and in response selects pairs of bit lines BLT[n-1:0], BLB[n-1:0] associated with one or more columns to be placed in communication with read/write circuits 24. Read/write circuits 24 are constructed in the conventional manner, for example to include the typical differential amplifier coupled to the bit lines for a column as selected by column select circuit 22 and a write circuit for selectively pulling toward ground one of the bit lines in the selected pair. The example of RAM 18 shown in FIG. 3 is constructed to an "interleaved" architecture, in which a given memory address selects one of every x (e.g., one of every four) columns for read or write access. The data words stored in memory array 20 are thus interleaved with one another, in the sense that the memory address decoded (in part) by column select circuit 22 selects one column in each group of columns, along the selected row. Alternatively, memory array 20 may be arranged in a non-interleaved fashion, in which each cell in the selected row is coupled to a corresponding read/write circuit in each cycle. In that architecture, read/write circuits 24 could reside between bit lines BL[n-1:0], and column select circuits 22, with the column select circuits selecting which read/write circuits 24 (and thus which columns) are in communication with data bus DATA I/O.

As discussed above in connection with the Background of the Invention, modern integrated circuits are now commonly constructed with extremely small minimum sized features, for example with metal-oxide-semiconductor (MOS) transistor gates having widths deep in the sub-micron regime. While these small feature sizes provide tremendous cell density and, in many respects, high device performance, reliability and stability issues also result from such scaling. As such, it has become no less important to properly screen, at the time of manufacture, memory arrays and other circuit functions in order to identify and repair, or remove from the population, those memory cells and devices that are vulnerable to failing the desired specifications over operating life. For RAM 18 constructed as described above, measures such as static noise margin, writeability, read current, and the like are of particular concern over the expected operating life.

Furthermore, the extreme thinness required of conventional gate dielectric layers (e.g., silicon dioxide) as transistor feature sizes have scaled into the deep submicron realm has rendered those materials unusable in many cases. In response, so-called "high-k" gate dielectrics, such as hafnium oxide ($HfO_2$), have higher dielectric constants than silicon dioxide and silicon nitride, permitting those films to be substantially thicker than the corresponding silicon dioxide gate films while remaining suitable for use in high performance MOS transistors. Gate electrodes of metals and metal compounds, such as titanium nitride, tantalum-silicon-nitride, tantalum carbide, and the like are now also popular in modern MOS technology, especially in combination with high-k gate dielectrics. These metal gate electrodes eliminate effects such as polysilicon depletion, such effects being noticeable at the extremely small feature sizes required of these technologies. As discussed above, it has been observed that modern high-k metal gate n-channel MOS transistors are susceptible to both negative bias temperature instability ("NBTI") and positive bias temperature instability ("PBTI").

Accordingly, it would be useful to screen CMOS SRAM cells to identify and repair, or discard, those memory cells and memories that are sufficiently marginal in static noise margin, writeability, and read current, among other attributes, that transistor degradation over the expected operating life would result in the loss of a stored data state, a read failure, or a write failure. It is particularly useful to provide such a screen in the case of SRAM cells constructed of high-k gate dielectric metal gate n-channel MOS transistors, due to their additional susceptibility to PBTI. Regardless of the screen, it is important to the manufacturer that such screens accurately test for the contemplated degradation mechanisms and effects, without significant overkill and thus undue yield loss.

Conventional SRAM cells and memories are not constructed to readily screen for these measures, especially as those measures may be affected by PBTI at the n-channel driver transistors. As such, conventional test vectors necessarily incorporate certain "proxies" for the effects of shifting device parameters, such as shifts in threshold voltage of n-channel driver transistors of SRAM cells. However, in order to properly screen for such effects as BTI, especially at the extremes of the temperature range, it has been observed that conventional test vectors often present an unrealistic bias condition to the cells under test. Such unrealistic test vectors have been observed to introduce other unintended effects and failure modes for the cells, beyond those related to transistor threshold shift. In addition, the necessary test vector voltages that may be applied by level shifters and other peripheral circuits in the memory architecture are often limited, by virtue of the design and capability of those peripheral circuits.

Figure 4A:
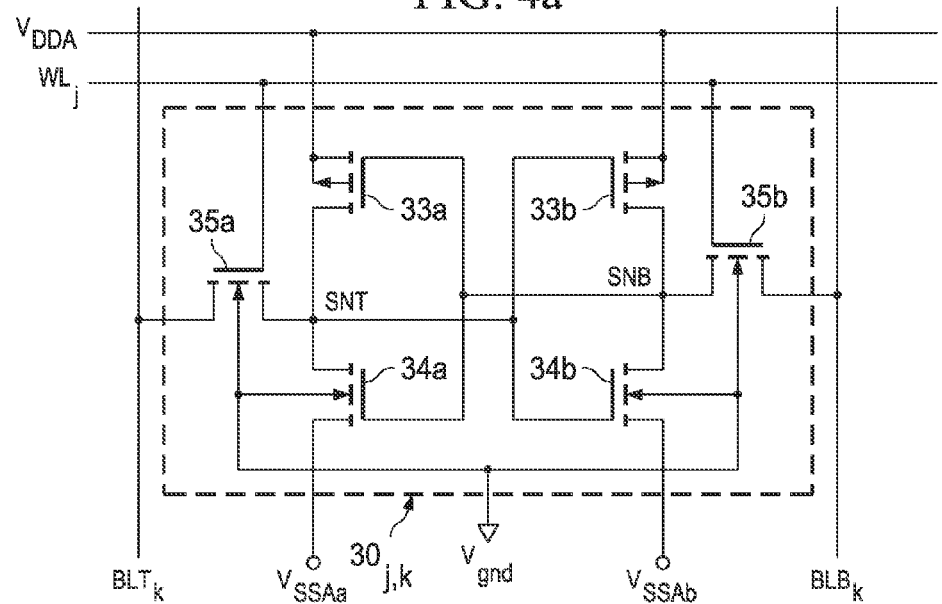
FIG. 4a is an electrical diagram, in schematic form, of an SRAM cell suitable for testing according to an embodiment of this invention.

According to embodiments of this invention, CMOS SRAM cells are constructed to enable a more direct screen for bias temperature instability (BTI) in the cell transistors. FIG. 4a illustrates an example of the construction of memory cell $30_{jk}$ of memory array 20, according to embodiments of this invention. Cell $30_{jk}$ includes, in the conventional manner, one CMOS inverter constructed from series-connected p-channel load transistor 33a and n-channel driver transistor 34a, and another CMOS inverter of series-connected p-channel load transistor 33b and n-channel transistor 34b. The gates of transistors 33a, 34a in one inverter are connected together and to the common drain node of transistors 33b, 34b of the opposite inverter at storage node SNB; similarly, the gates of transistors 33b, 34b are connected together and to the common drain node of transistors 33a, 34a at storage node SNT. N-channel pass-gate transistors 35a, 35b have their source/drain paths connected between storage nodes SNT, SNB, respectively, and respective bit lines $BLT_k$, $BLB_k$ for column k of array 20. Word line $WL_j$ for row j controls the gates of transistors 35a, 35b. Alternatively, in embodiments of this invention, cell $30_{jk}$ may be constructed in a "single-sided" manner, in which case only a single pass-gate transistor coupling one of the storage nodes SNT, SNB to a single bit line will be provided.

According to embodiments of this invention, the source nodes of driver transistor 34a and driver transistor 34b are connected to separate array ground voltage nodes $V_{SSAa}$, $V_{SSAb}$, respectively. The source nodes of load transistors 33a, 33b are connected in common to array power supply voltage node $V_{DDA}$, and the body nodes of n-channel driver transistors 34a, 34b, and n-channel pass transistors 35a, 35b, are connected together and biased by a voltage $V_{gnd}$. As will be described below, these separate ground voltage nodes $V_{SSAa}$, $V_{SSAb}$ enable transistors 34a, 34b to be placed under different biases from one another. It is contemplated that the application of asymmetric transistor biases by way of different array ground voltage nodes $V_{SSAa}$, $V_{SSAb}$ during functional test can mimic threshold voltage shifts at a corresponding one of driver transistors 34a, 34b, and also to some extent at a corresponding one of pass transistors 35a, 35b. More specifically, the application of a voltage above array ground voltage $V_{gnd}$ at one of array ground voltage nodes $V_{SSAa}$, $V_{SSAb}$ will reduce the bias (i.e., the gate-to-source voltage or drain-to-source voltage, or both) applied at its corresponding driver transistor 34a, 34b, and perhaps also the bias at its corresponding pass transistor 35a, 35b, reducing the drive strength of that transistor or transistors relative to transistors continuing to receive the full bias of a nominal ground voltage. The reduced drive strength can thus mimic the effect of a higher threshold voltage at the affected transistors, and thus the effect of PBTI degradation of those devices as may occur over operating life.

Figure 4B:
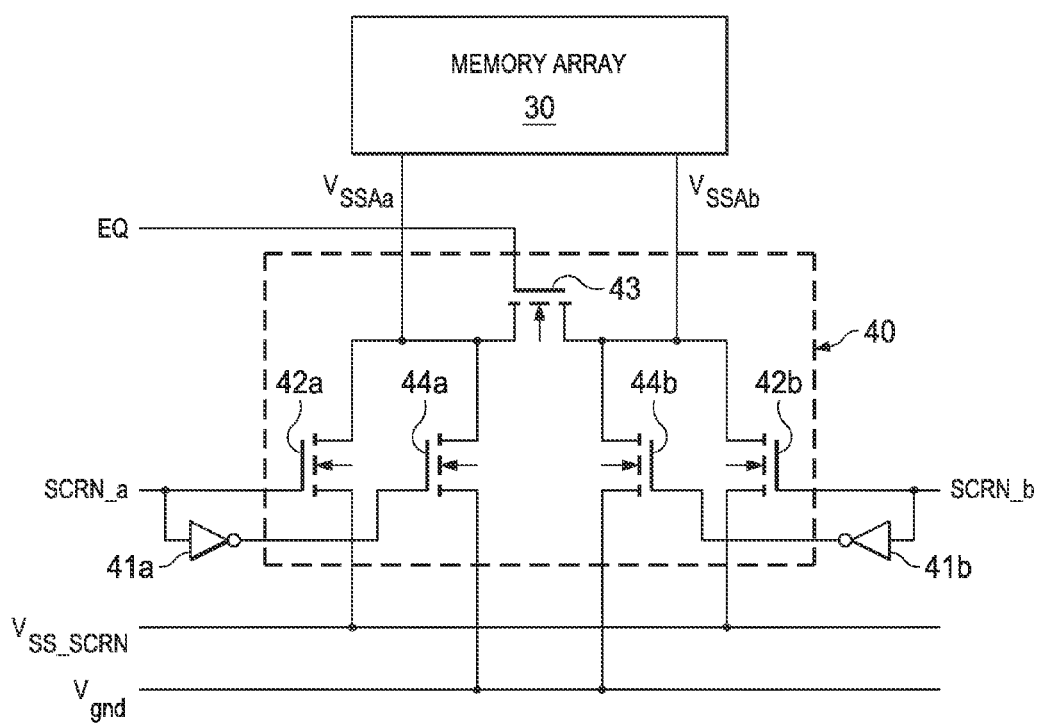
FIG. 4b is an electrical diagram, in schematic form, of bias voltage select circuitry used in connection with the SRAM cell of FIG. 4a according to that embodiment of the invention.

According to this embodiment of the invention, circuitry is provided outside of memory array 20 to control the application of voltages to array ground voltage nodes $V_{SSAa}$, $V_{SSAb}$. FIG. 4b illustrates an example of ground voltage select circuitry 40 suitable for use in connection with this embodiment of the invention. As evident from FIG. 4b, ground voltage select circuitry 40 resides outside of memory array 20, and applies a selected voltage to each of array ground voltage nodes $V_{SSAa}$, $V_{SSAb}$, in response to control signals SCRN_a, SCRN_b, and EQ generated by control circuitry (not shown) elsewhere in RAM 18 or integrated circuit 10 (e.g., system control 14). It is contemplated that those skilled in the art having reference to this specification will be readily able to generate the appropriate levels of control signals SCRN_a, SCRN_b, EQ for carrying out the normal operation and screen functions described below in this specification.

As shown in FIG. 4b, ground voltage select circuitry 40 receives two power supply voltages as inputs, namely normal ground voltage $V_{gnd}$ (which, in this example, is the bias voltage applied to body nodes of n-channel transistors 34, 35 in cell $30_{jk}$ as discussed above) and screen ground voltage $V_{SS\_SCRN}$. It is contemplated that voltage regulator or level shift circuitry elsewhere in RAM 18 or integrated circuit 10 can generate screen ground voltage $V_{SS\_SCRN}$ at a different (i.e., higher) voltage than normal ground voltage $V_{gnd}$. On its array side, ground voltage select circuitry 40 is connected to array ground voltage nodes $V_{SSAa}$, $V_{SSAb}$; as such, the function of ground voltage select circuitry 40 is to apply the appropriate ones of normal ground voltage $V_{gnd}$ and screen ground voltage $V_{SSA\_SCRN}$ to array ground voltage nodes $V_{SSAa}$, $V_{SSAb}$ for the particular operating mode or screen during test.

In this embodiment of the invention, ground voltage select circuitry 40 includes n-channel MOS pass transistor 42a having its source/drain path connected between screen ground voltage $V_{SSA\_SCRN}$ and array ground voltage node $V_{SSAa}$, and re-channel pass transistor 44a having its source/drain path connected between normal ground voltage $V_{gnd}$ and array ground voltage node $V_{SSAa}$. The gate of transistor 42a receives control signal SCRN_a, and the gate of transistor 44a receives the logical complement of control signal SCRN_a (via inverter 41a). Similarly, n-channel pass transistor 42b has its source/drain path connected between screen ground voltage $V_{SSA\_SCRN}$ and array ground voltage node $V_{SSAb}$, and n-channel pass transistor 44b has its source/drain path connected between normal ground voltage $V_{gnd}$ and array ground voltage node $V_{SSAb}$. The gate of transistor 42b receives control signal SCRN_b, and the gate of transistor 44b receives the logical complement of control signal SCRN_b (via inverter 41b). Equalization transistor 43 is an n-channel transistor with its source/drain path connected between array ground voltage nodes $V_{SSAa}$ and $V_{SSAb}$, and its gate receiving equalization signal EQ. Equalization signal EQ may be generated by external control circuitry as noted above, or alternatively may be produced by logic circuitry according to control signals SCRN_a, SCRN_b (e.g., the logical AND of the outputs of inverters 41a, 41b).

In normal operation, control signals SCRN_a, SCRN_b will both be inactive at a low logic level. Transistors 42a, 42b will both be off, and transistors 44a, 44b will both be on, in ground voltage select circuitry 40. This will apply normal ground voltage $V_{gnd}$ to both of array ground voltage nodes $V_{SSAa}$, $V_{SSBb}$. In this normal mode, it is contemplated that equalization control signal EQ will be active at a high logic level, turning on equalization transistor 43 to ensure symmetric application of normal ground voltage $V_{gnd}$ to array ground voltage nodes $V_{SSAa}$, $V_{SSBb}$. In operation during test, for example to carry out an asymmetric bias screen in the manner described in further detail below, one or the other of control signals SCRN_a, SCRN_b will be asserted active, while the other remains inactive. For example, in response to control signal SCRN_a being driven active and control signal SCRN_b remaining inactive, transistor 42a will be turned on and transistor 44a will be off, which connects screen ground voltage $V_{SSA\_SCRN}$ to array ground voltage node $V_{SSAa}$; transistors 42b, 44b will be off and on, respectively, connecting normal ground voltage $V_{gnd}$ to array ground voltage node $V_{SSAb}$. Equalization transistor 43 will be turned off in this situation (equalization signal EQ inactive), to allow array ground voltage nodes $V_{SSAa}$, $V_{SSAb}$ to reach different voltages from one another, and thus result in an asymmetric bias at cells 30 in memory array 20. Conversely, with control signal SCRN_b active and control signal SCRN_a inactive, array ground voltage node $V_{SSAb}$ will receive screen ground voltage $V_{SSA\_SCRN}$ and array ground voltage node $V_{SSAa}$ will receive normal ground voltage $V_{gnd}$.

It is contemplated that multiple cells 30 within memory array 20 will receive array ground voltage nodes $V_{SSAa}$, $V_{SSAb}$ according to this embodiment of the invention. For example, it is contemplated that every cell 30 within memory array 20 will receive array ground voltage nodes $V_{SSAa}$, $V_{SSAb}$ in similar manner as described above for the case of cell $30_{jk}$ of FIG. 4a. Alternatively, it is contemplated that multiple instances of ground voltage select circuitry 40, and thus multiple instances of paired array ground voltage nodes $V_{SSAa}$, $V_{SSAb}$, may be provided in connection with memory array 30. In any event, it is contemplated that cells 30 in the same column k as cell $30_{jk}$ (or in the same row j, depending on the orientation of memory array 20 relative to the run of conductors corresponding to array ground voltage nodes $V_{SSAa}$, $V_{SSAb}$) will share array ground voltage nodes $V_{SSAa}$, $V_{SSAb}$.

It is contemplated that conductors corresponding to array ground voltage nodes $V_{SSAa}$, $V_{SSAb}$ can be readily routed through memory array 20, providing the capability for the PBTI screens described in further detail below, without significantly increasing the chip area required for these separate conductors. FIG. 4c illustrates an example of the layout of cell $30_{jk}$ of FIG. 4a, and portions of its immediately adjacent cells within the same row j (i.e., in columns k−1 and k+1) as constructed at the surface of a silicon substrate, fabricated according to CMOS technology and according to an embodiment of this invention, and at a stage in the manufacture prior to the formation of overlying metal layers. As will become apparent, chip area efficiency is accomplished by routing array ground voltage node conductors so that cells in adjacent columns can share a common array ground voltage node conductor, as will now be described.

In the plan view of FIG. 4c, active regions 54 are locations of the surface of an n-well or a p-well, as the case may be, at which dielectric isolation structures 53 are not present. As known in the art, isolation dielectric structures 53 are relatively thick structures of silicon dioxide or another dielectric material, intended to isolation transistor source and drain regions in separate transistors from one another. Isolation dielectric structures 53 are typically formed by way of shallow trench isolation (STI) structures in modern high-density integrated circuits, or alternatively by the well-known local oxidation of silicon (LOCOS) process. FIG. 4c illustrates the boundaries of p-wells 52 and n-wells 55, within which active regions 54 are defined. These well regions will receive the appropriate body node bias via metal conductors (not shown), in the conventional manner.

As well known in the art, transistors are formed at locations of active regions 54 that underlie gate elements 56, separated therefrom by gate dielectric material (not visible in FIG. 4c). Various materials may be used for gate element 56 and for this gate dielectric, as described above. Commonly used materials include polycrystalline silicon for gate element 56, and silicon dioxide or silicon nitride (or a combination of the two) for the gate dielectric. Those conventional materials are suitable for use with embodiments of this invention. High-k dielectric materials such as hafnium oxide ($HfO_2$) are becoming favored for use in high-performance transistors, in combination with metals or conductive metal compounds for gate elements 56, examples of which include titanium nitride, tantalum silicon nitride, and tantalum carbide. Other examples of these high-k gate dielectric materials and metal gate materials are known in the art. It is contemplated that embodiments of this invention are especially well-suited for use in connection with such modern transistor materials, particularly considering that these embodiments of the invention can readily screen for device instabilities such as PBTI, to which transistors using those modern materials have been observed to be susceptible.

FIG. 4c illustrates the locations of contact openings 58 that extend through overlying insulator material (not shown) to active regions 54 or to gate elements 56, at the case may be. Metal conductors (e.g., those shown schematically in FIG. 4c for storage nodes SNT, SNB) will be patterned to form conductors that overlie the structure, making contact to active regions 54 or gate elements 56 (or both) via respective contact openings 58.

FIG. 4c illustrates the outline of the various transistors 33, 34, 35 within cell 30$_{jk}$, corresponding to the electrical schematic of FIG. 4a. It is contemplated that those skilled in the art will be able to follow the schematic of FIG. 4a within the layout of FIG. 4c. The orientation of the plan view of FIG. 4a is such that cell 30$_{j,k}$ in row m and column k is highlighted. Above and below SRAM cell 30$_{m,k}$ are cells 30$_{m,k-1}$, 30$_{m,k+1}$, which also reside in the same row m but in columns k and k+1, respectively. SRAM cell 30$_{m+1,k}$ is along the right-hand side of cell 30$_{m,k}$, residing in the same column k but in neighboring row m+1.

As mentioned above, the metal conductor schematically shown as storage node SNB connects active region 54 at the drain of transistor 34b and one side of pass transistor 35b to active region 54 at the drain of transistor 33b and to gate element 56 serving as the gate of transistors 33a, 34a (via a shared contact opening 58). Similarly, the metal conductor schematically shown as storage node SNT connects active region 54 between transistors 34a, 35a to active region 54 at the drain of transistor 33a, and (via shared contact opening 58) to gate element 56 serving as the gates of transistors 33b, 34b. The routing of array power supply node conductor $V_{DDA}$ is illustrated in FIG. 4c, including those locations at which it makes contact (via contact openings 58) to the source nodes of transistors 34a, 34b. Bit lines $BLT_k$, $BLB_k$, and word line $WL_j$ are connected, via metal conductors (not shown) and contact openings 58 to the appropriate elements within cell 30$_{jk}$ as shown in FIG. 4c, according to the electrical schematic of FIG. 4a.

According to this embodiment of the invention, metal conductors for array ground voltage nodes $V_{SSAa}$, $V_{SSAb}$ run parallel to the conductor for array power supply voltage node $V_{DDA}$, as shown schematically in FIG. 4c. The metal conductor for array ground voltage node $V_{SSAa}$ connects, via contact openings 58, to the source node of transistor 34a in cell 30$_{jk}$ and also to the source node of transistor 34a of cell 30$_{j,k+1}$ in adjacent column k+1. Similarly, the metal conductor for array ground voltage node $V_{SSAb}$ connects, via contact openings 58, to the source node of transistor 34b in cell 30$_{jk}$ and also to the source node of transistor 34b of cell 30$_{j,k-1}$ in adjacent column k−1. As such, it is contemplated that separate array ground voltage nodes $V_{SSAa}$, $V_{SSAb}$ within memory array 20 can be implemented with little if any impact on the overall cell chip area.

Figure 5C:
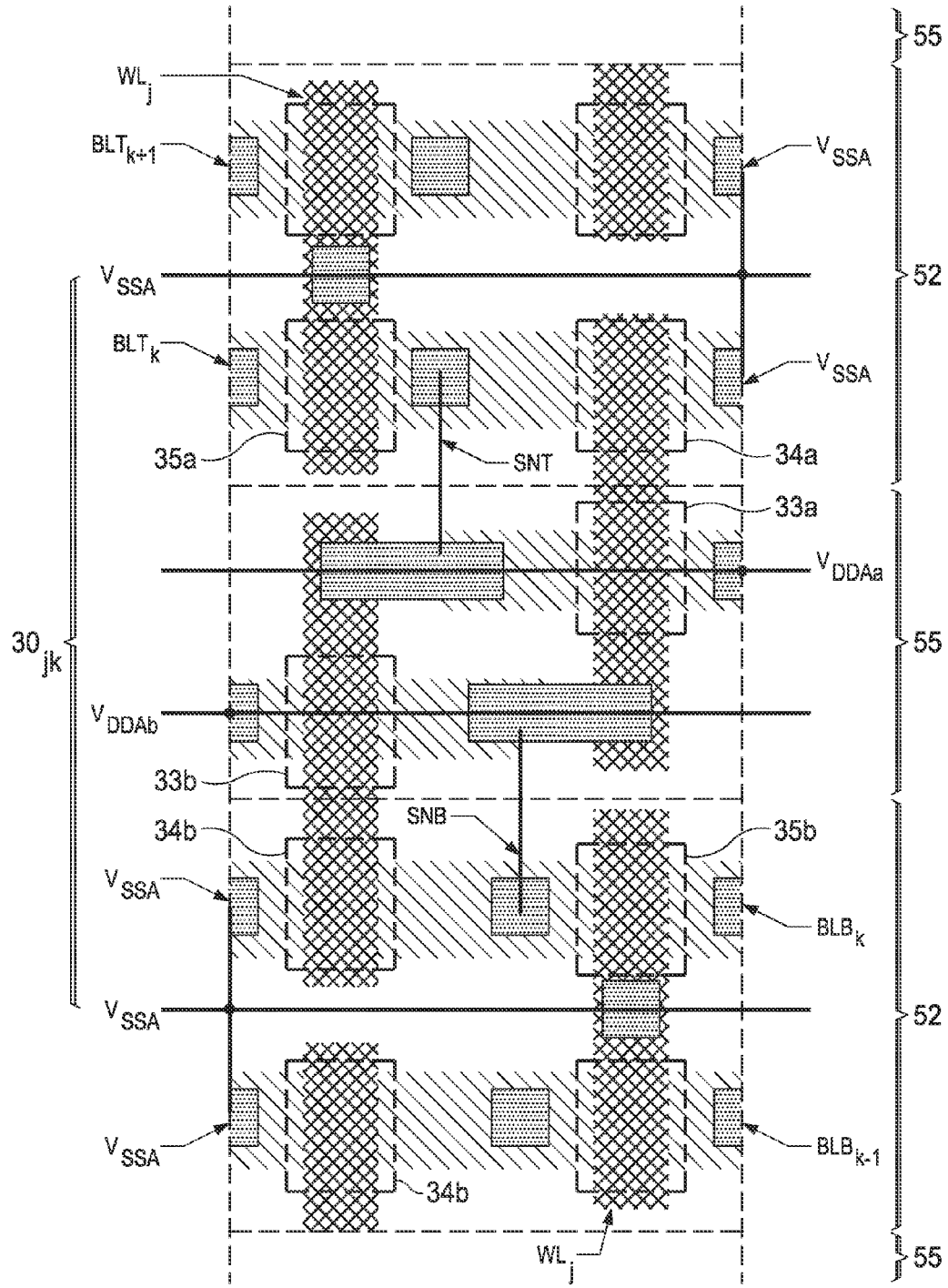
FIG. 5c is a plan view of a portion of the memory of FIG. 3 including the SRAM cell of FIG. 5a according to that embodiment of the invention.

Referring now to FIGS. 5a through 5c, the construction of SRAM cell 30'$_{jk}$ and associated support circuitry within RAM 18 according to another embodiment of this invention will now be described in detail. Cell 30'$_{jk}$ is constructed in similar manner as cell 30$_{jk}$ of FIG. 4a, with a pair of cross-coupled CMOS inverters, one of which consisting of p-channel load transistor 33a and n-channel driver transistor 34a, and the other as p-channel load transistor 33b and n-channel transistor 34b. The cross-coupling of these two inverters is effected by the gates of transistors 33a, 34a both connected to the common drain node of transistors 33b, 34b together at storage node SNB, and by the gates of transistors 33b, 34b connected together to the common drain node of transistors 33a, 34a at storage node SNT. Pass-gate transistors 35a, 35b respectively selectively couple storage nodes SNT, SNB to bit lines $BLT_k$, $BLB_k$, respectively, of column k in response to the activation of word line $WL_j$ for row j.

According to this embodiment of this invention, the source nodes of load transistor 33a and load transistor 33b are connected to separate array power supply voltage nodes $V_{DDAa}$, $V_{DDAb}$, respectively. The source nodes of driver transistors 34a, 34b are connected in common to array ground voltage node $V_{SSA}$, and the body nodes of p-channel load transistors 33a, 33b are connected in common to array power supply voltage $V_{DDA}$. The separate array power supply voltage nodes $V_{DDAa}$, $V_{DDAb}$ enable transistors 33a, 33b to receive different biases from one another. More specifically, the application of a voltage below array power supply voltage $V_{DDA}$ at one of array power supply voltage nodes $V_{DDAa}$, $V_{DDAb}$ will asymmetrically reduce the bias (i.e., the gate-to-source voltage, the drain-to-source voltage, or both) of its corresponding load transistor 33a, 33b, reducing its drive in a manner similar to the effect of NBTI degradation. This asymmetric bias is thus useful in performing a time-zero screen for cells 30' that are vulnerable to failure due to NBTI degradation.

Similarly as shown in FIG. 4b described above, FIG. 5b illustrates an example of power supply voltage select circuitry 45 suitable for use in connection with cell 30'$_{jk}$ according to this embodiment of the invention. As before, power voltage select circuitry 45 resides outside of memory array 20, and selectively applies voltages to array power supply voltage nodes $V_{DDAa}$, $V_{DDAb}$, in response to control signals SCRN_a, SCRN_b/, and EQ/ generated by control circuitry (not shown) elsewhere in RAM 18 or integrated circuit 10 (e.g., system control 14). The "/" signal designator for these signal lines indicates that these control signals are active at a low logic level. It is contemplated that those skilled in the art having reference to this specification will be readily able to generate the appropriate levels of control signals SCRN_a/, SCRN_b/, EQ/ for carrying out the normal operation and screen functions described below in this specification.

Power supply voltage select circuitry 45 is constructed similarly as ground voltage select circuitry 40 described above in connection with FIG. 4b, in essentially a complementary fashion. As such, power supply voltage select circuitry 45 includes p-channel MOS pass transistor 46a with its source/drain path connected between screen power supply voltage $V_{DDA\_SCRN}$ and array power supply voltage node $V_{DDAa}$, and p-channel pass transistor 48a having its source/drain path connected between normal power voltage $V_{DDA}$ and array power voltage node $V_{DDAa}$. The gate of transistor 46a receives control signal SCRN_a/, and the gate of transistor 48a receives the logical complement of control signal SCRN_a/ via inverter 47a. Similarly, p-channel pass transistor 46b has its source/drain path connected between screen power supply voltage $V_{DDA\_SCRN}$ and array power supply voltage node $V_{DDAb}$, and p-channel pass transistor 48b has its source/drain path connected between normal power supply voltage $V_{DDA}$ and array power supply voltage node $V_{DDAb}$. The gate of transistor 46b receives control signal SCRN_b/, and the gate of transistor 48b receives the logical complement of control signal SCRN_b/ via inverter 47b. Equalization transistor 49 is a p-channel transistor with its source/drain path connected between array power supply voltage nodes $V_{DDAa}$ and $V_{DDAb}$, and its gate receiving equalization signal EQ/. Equalization signal EQ/ may be generated by external control circuitry as noted above, or alternatively may be produced by logic circuitry as the logical NAND of control signals SCRN_a/, SCRN_b/ or in some other logical arrangement.

Power supply voltages $V_{DDA}$ and screen power supply voltage $V_{DD\_SCRN}$ may be generated by conventional voltage regulator or level shift circuitry elsewhere in RAM 18 or in integrated circuit 10. For purposes of this embodiment of the invention, screen power supply voltage $V_{DD\_SCRN}$ will typically be at a lower voltage than normal power supply voltage $V_{DDA}$.

In normal operation, control signals SCRN_a/, SCRN_b/ will both be inactive (at a high logic level), which turns off both of transistors 46a, 46b and turns on transistors 48a, 48b. Typically, equalization control signal EQ/ will be at an active low level during normal operation, turning on transistor 49. In this condition, normal power supply voltage $V_{DDA}$ is applied to both of array power supply voltage nodes $V_{DDAa}$, $V_{DDAb}$, with equalization transistor 49 ensuring symmetric application of that voltage. During a time-zero screen test, one or the other of control signals SCRN_a/, SCRN_b/will be asserted active (low), while the other remains inactive (high); equalization control signal EQ/ will be driven inactive (high). Screen power supply voltage $V_{DDA\_SCRN}$ will be applied to the one of array power supply nodes $V_{DDAa}$, $V_{DDAb}$ connected to the one of transistor 46a, 46b turned on by the active one of control signals SCRN_a/, SCRN_b/, applying an asymmetric bias to load transistors 33a, 33b in one or more cells 30' within memory array 20.

Similarly as described above in connection with FIGS. 4a through 4c, conductors corresponding to array power supply voltage nodes $V_{DDAa}$, $V_{DDAb}$ can be readily routed through memory array 20, without significantly increasing the chip area required for these separate conductors. FIG. 5c illustrates an example of the layout of cell $30'_{jk}$ of FIG. 5a, as constructed at the surface of a silicon substrate, fabricated according to CMOS technology and according to an embodiment of this invention, and at a stage in the manufacture prior to the formation of overlying metal layers.

The arrangement of the transistors, active regions 54, gate elements 56, contact openings 58, and isolation dielectric structures 53, of cell $30'_{jk}$ is essentially identical to that described above in connection with FIG. 4c. Cell $30'_{jk}$ differs, however, in connection with the routing of metal conductors for array power supply voltage nodes $V_{DDAa}$, $V_{DDAb}$. In this embodiment of the invention, the metal conductor for array power supply voltage node $V_{DDAa}$ runs parallel to the conductor for array ground voltage node $V_{SSA}$, and connects to the source node of transistor 33a in cell $30'_{jk}$ via a contact opening 58. Similarly, the metal conductor for array power supply voltage node $V_{DDAb}$ connects to the source node of transistor 33b in cell $30'_{jk}$ via a corresponding contact opening 58.

As evident from FIG. 5c, the metal conductors for array power supply voltage nodes $V_{DDAa}$, $V_{DDAb}$ are not shared between adjacent columns in this implementation. However, it is contemplated that the chip area effect of this routing in the layout of cell $30'_{jk}$ will be minimal, particularly if the metal conductors for array power supply voltage nodes $V_{DDAa}$, $V_{DDAb}$ can run directly over their respective contact openings 58 to transistors 33a, 33b as shown. Alternatively, it is contemplated that cell $30'_{jk}$ can be laid out in such a manner as to enable the sharing of these metal conductors between adjacent columns.

Figure 6:
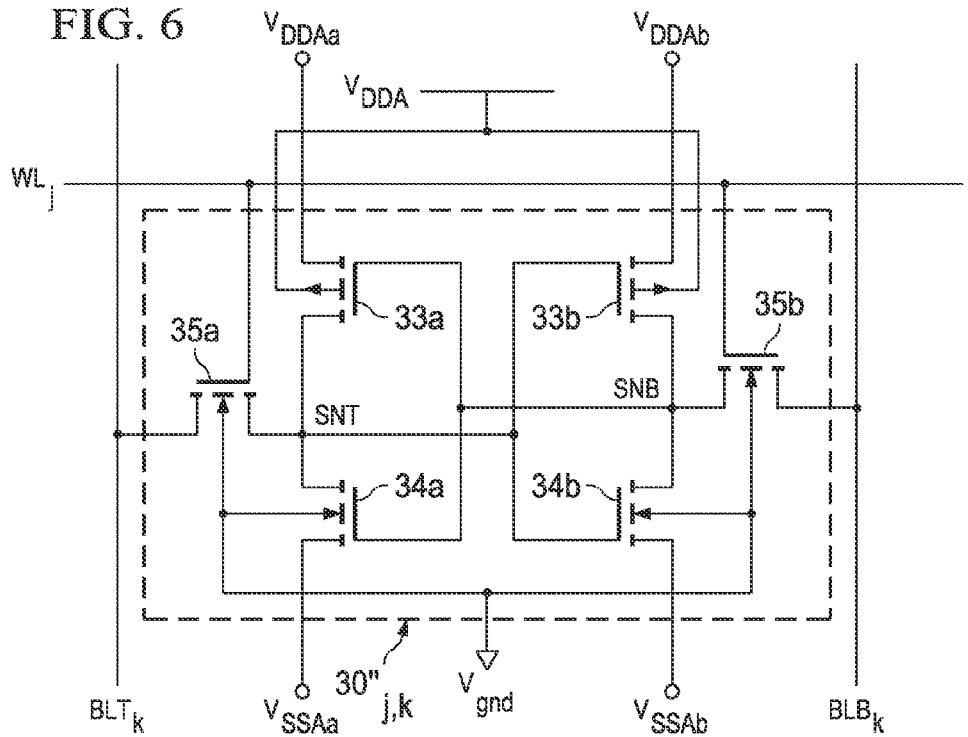
FIG. 6 is an electrical diagram, in schematic form, of an SRAM cell suitable for testing according to another embodiment of this invention.

FIG. 6 illustrates cell $30''_{jk}$ constructed according to another embodiment of this invention. Cell $30''_{jk}$ is constructed in similar manner as cells $30_{jk}$ and $30'_{jk}$ of FIGS. 4a and 5a, respectively. In particular, cell $30''_{jk}$ is constructed as a "6-T" SRAM cell in which the cross-coupled CMOS inverters may be biased separately from one another both at the source node of the p-channel load transistor and at the source node of the n-channel driver transistor. More specifically, according to this embodiment of this invention, the source nodes of p-channel load transistors 33a, 33b are connected to separate array power supply voltage nodes $V_{DDAa}$, $V_{DDAb}$, respectively; in addition, the source nodes of n-channel driver transistors 34a, 34b are connected to separate array ground voltage nodes $V_{SSAa}$, $V_{SSAb}$, respectively. The body nodes of load transistors 33a, 33b are connected in common to array power supply voltage $V_{DD}$ and the body nodes of driver transistors 34a, 34b are connected in common to array ground voltage $V_{gnd}$. As such, according to this embodiment, load transistors 33a, 33b can be asymmetrically biased by way of a voltage below array power supply voltage $V_{DD}$ applied to one of array power supply voltage nodes $V_{DDAa}$, $V_{DDAb}$, and driver transistors 34a, 34b can be asymmetrically biased by way of a voltage above array ground voltage $V_{gnd}$ applied to one of array ground voltages nodes $V_{SSAa}$, $V_{SSAb}$. This asymmetric bias is thus useful in performing a time-zero screen for cells 30' that are vulnerable to failure due either or both of PBTI and NBTI degradation.

It is contemplated that memory array 20 constructed with cells 30" as described above in connection with FIG. 6 will include both power supply voltage select circuitry 45 and also ground voltage select circuitry 40. In this regard, it is contemplated that the respective control signals SCRN_a, SCRN_b, SCRN_a/, SCRN_b/, EQ, EQ/ can be combined and generated in an efficient manner by the appropriate control circuitry. It is further contemplated that the layout of FIGS. 4c and 5c can be readily modified by those skilled in the art having reference to this specification so as to incorporate both pairs of power supply and ground conductors $V_{DDAa}$, $V_{DDAb}$, $V_{SSAa}$, $V_{SSAb}$ as appropriate.

It is of course contemplated that the particular schematic circuit arrangement, physical layout, and construction of memory array 20 and its constituent SRAM cells 30, 30', 30" may vary significantly from that shown in FIGS. 4a through 4c, 5a through 5c, and 6 and described herein, such variations and alternatives being apparent to those skilled in the art having reference to this specification, yet remain within the scope of this invention. It is therefore to be understood that this description of the architecture, layout, and construction of memory array 20 and SRAM cells 30, 30', 30" is provided by way of example only.

Figure 7:
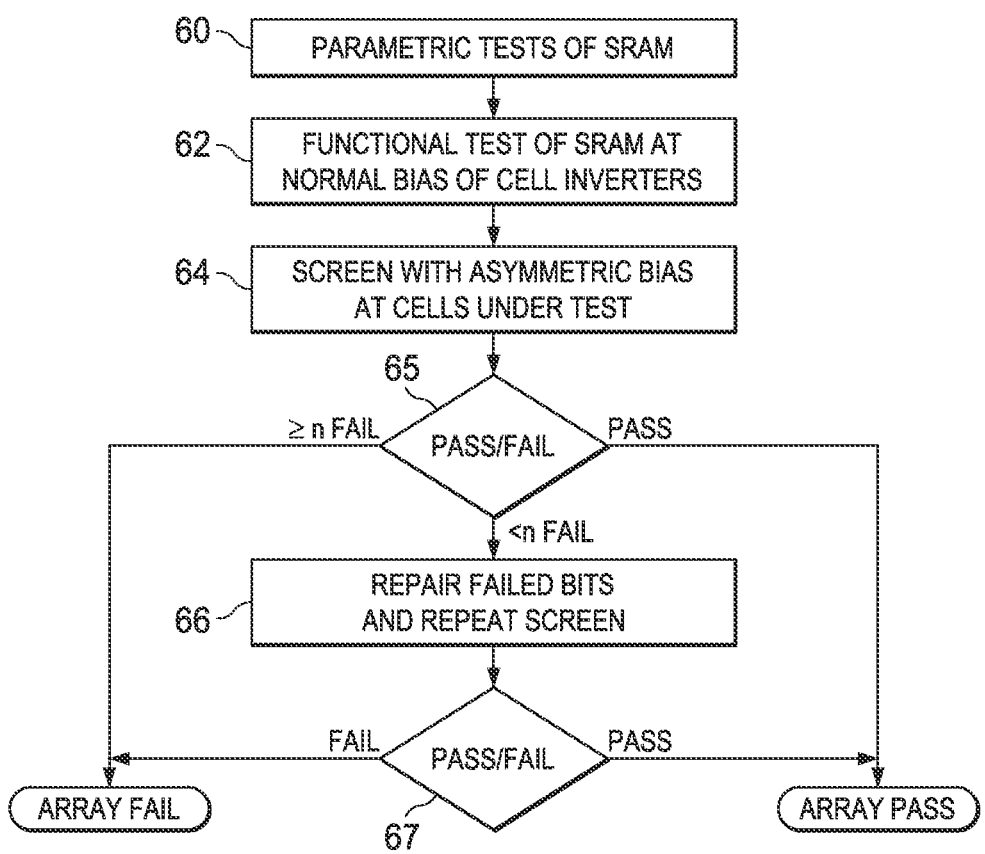
FIG. 7 is a flow diagram of a method of testing the memory of FIG. 3 according to embodiments of this invention.

Referring now to FIG. 7, a method of testing and screening SRAM cells 30 within RAM 18 of integrated circuit 10, or as a stand-alone memory integrated circuit, as the case may be, according to embodiments of this invention will now be described. It is contemplated that the test process of embodiments of this invention, which involves the application of asymmetric bias voltages to inverter transistors within cells 30 under test within memory array 20 as will be described below, is well suited for wafer-level testing (i.e., "multiprobe" functional testing), prior to packaging of integrated circuit 10, because of the ability to replace marginal cells by way of conventional redundancy techniques at that stage of manufacture. Of course, the test process of FIG. 7 may additionally or instead be performed after packaging, as desired.

It is contemplated that the method of FIG. 7 will typically be performed by way of automated test equipment, for example automated test equipment as used in functionally testing integrated circuits 10. The method of FIG. 7 will be described in connection with the testing of a population of memory cells, for example the testing of array 20 of RAM 18 of FIG. 3. It is contemplated that the particular test sequence may alternatively be applied fully to each memory cell in sequence (i.e., the entire test sequence performed for each cell 30 in turn). Further in the alternative, the test sequence may be applied to cells 30 in a row, column, or sub-array of array 20, or to some other population smaller than the entire array 20. As such, while the method described below in connection with FIG. 7 will refer to a population of cells 30 under test, it is to be understood that the number of cells 30 in that population can number from one to the entire array 20. It is contemplated that those skilled in the art having reference to this specification will be readily able to apply the test sequence of FIG. 7 to the appropriate number of memory cells 30 for specific memory architectures.

The manufacturing test flow shown in FIG. 7 according to embodiments of the invention begins with process 60 in which conventional parametric tests of both the DC and operating type (e.g., continuity, leakage, standby and active power dissipation, etc.) are performed upon RAM 18 under test. As described above and as will be described in further detail below, the screens according to embodiments of this invention are intended to identify those SRAM cells 30 that are vulnerable to failure over operating life. As such, functional tests are performed by the automated test equipment, in process 62, to evaluate the ability of RAM 18 to be written and read with both data states under such operating conditions and timing constraints required by specifications. According to these embodiments of the invention, parametric test process 60 and functional test process 62 are contemplated to be performed using "normal" bias voltages applied symmetrically to the inverters of SRAM cells 30. These "normal" bias voltages applied to cells 30 refer to array power supply voltage levels and array ground voltage levels consistent with normal operating specifications and tolerances for RAM 18. For example, if the performance of RAM 18 is specified over a range of array power supply voltage ($V_{DDA}$, for example) of 1.20 volts±5% relative to the array ground voltage ($V_{SSA}$, for example), a "normal" bias applied to the series-connected load and driver transistors of the inverters of SRAM cell $30_{jk}$ will be 1.20 volts±5%, adjusted by any guardbanding in the test process associated with the specified temperature range, noise margin, and the like. The "symmetric" biases contemplated to be applied in processes 60, 62 refers to the application of essentially identical voltages to both load transistors, and to both driver transistors, within each SRAM cell 30 under test. Processes 60 and 62 thus remove, from the population of SRAM cells 30 or of integrated circuits 10 in the aggregate, those devices that do not meet the time-zero specifications desired of those functions. This ensures that the screen processes performed according to embodiments of this invention are applied only to devices that are known to be functionally and parametrically acceptable at normal and symmetric biases. Alternatively, the voltages applied in processes 60, 62 may stray from the "normal" range as desired by the test designer, so long as a known "0" data state is written into cells 30 under test.

According to this embodiment of the invention, asymmetric bias screen process 64 is then performed by the automated test equipment on one or more SRAM cells 30 in RAM 18, to determine whether any of those cells 30 may be vulnerable to shifts in transistor characteristics due to PBTI- and NBTI-caused threshold voltage shifts insofar as such shifts affect the read performance, write performance, read stability, and retention stability of cells 30 under test. According to embodiments of this invention, one or more particular test sequences are included within asymmetric bias screen process 64, each such sequence applying reduced bias to transistors in one of the inverters within each cell 30 under test in order to determine whether that cell is vulnerable to threshold voltage degradation due to PBTI or NBTI, as the case may be.

Figure 8B:
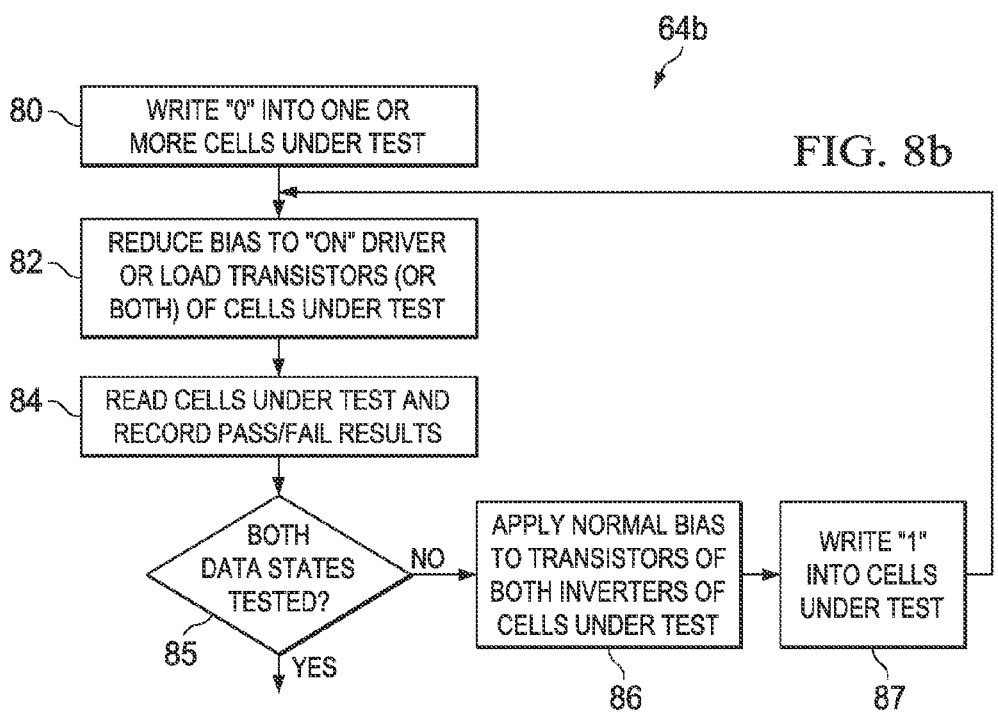
FIGS. 8a through 8d are flow diagrams of screens within the test method of FIG. 6, according to an embodiment of this invention.
Figure 8A:
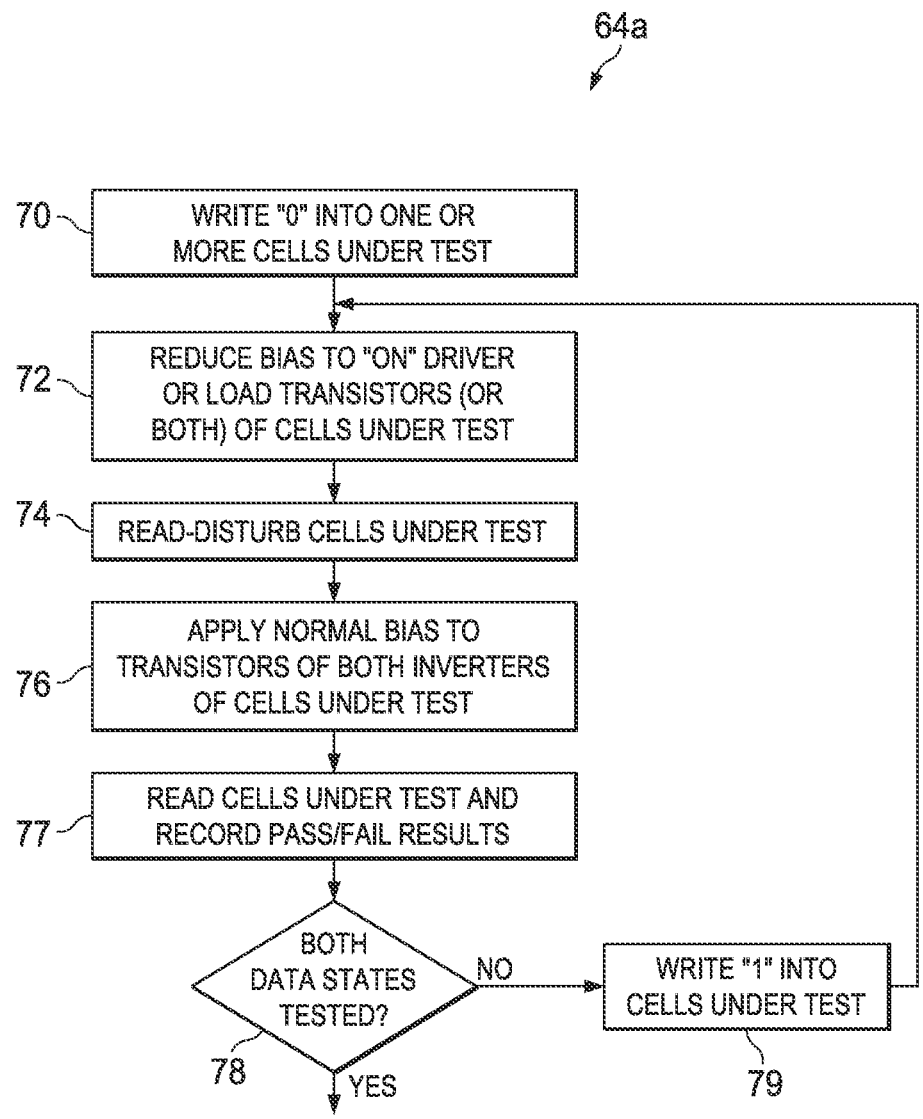

FIG. 8a illustrates a method for performing one of these test sequences, namely read stability test sequence 64a as applied to one or more SRAM cells 30. For purposes of the following description, including the description in connection with FIGS. 8b and 8c, reference will be made to SRAM cells 30 under test, with the understanding that such cells 30 refer to SRAM cells constructed as any of cells $30_{jk}$, $30'_{jk}$, $30''_{jk}$ described above or variations thereof. As shown in FIG. 8a, test sequence 64a in this example begins with the writing of a known data state (e.g., "0") into each of the SRAM cells 30 under test, in process 70. Process 70 is typically performed under normal bias conditions; if desired, a read of those SRAM cells 30 may be performed to verify the written data state into these cells.

As described above, the primary effect of PBTI is a positive shift in the threshold voltage of n-channel transistors, particularly those at which a positive gate voltage (relative to the transistor channel region) has been present for some duration. Conversely, the primary effect of NBTI is a positive shift in the threshold voltage of p-channel transistors receiving a negative gate voltage for some duration. In each case, the increased threshold voltage weakens the drive of the transistor, slowing its switching and also reducing its source/drain current in the "on" state. Also as discussed above, read stability failures occur when the threshold voltage has shifted for either or both of the "on" state load transistor 33a, 33b or the "on" state driver transistor 34b, 34a for the current data state. Following process 70, load transistor 33b and driver transistor 34a are the "on" state transistors.

According to this embodiment of the invention, the effect of BTI threshold shift is mimicked by the application of a reduced bias to either or both of the "on" state transistors, namely load transistor 33b and driver transistor 34a, for each SRAM cell 30 currently under test. The particular transistor receiving the reduced bias will of course depend on the construction of SRAM cell 30, according to the examples described above relative to FIGS. 4a, 5a and 6. For the example of cell 30$_{jk}$ of FIG. 4a, a higher voltage will be applied at array ground voltage node V$_{SSAa}$ than at array ground voltage node V$_{SSAb}$ in process 72. It is contemplated that the voltage differential between array ground voltage nodes V$_{SSAa}$ and V$_{SSAb}$ will be on the order of 10% of the nominal bias voltage for the inverters of cell 30. For example, if array power supply voltage V$_{DDA}$ is nominally at 1.2 volts above normal ground voltage V$_{gnd}$, array ground voltage node V$_{SSAa}$ may receive a voltage that is about 100 mV above array ground voltage V$_{gnd}$. To further tighten the screen, array power supply voltage V$_{DDA}$ may be set at its minimum specification level (e.g., 1.0 volts) in process 72.

Of course, in the cases in which the alternative constructions of cells 30'$_{jk}$ and 30"$_{jk}$ are implemented in memory array 20, the asymmetric bias applied in process 72 may instead or additionally apply a lower voltage to array power supply voltage node V$_{DDAb}$ than at array power supply voltage node V$_{DDAa}$, reducing the bias at load transistor 33b for the case of this "0" data state.

Once the asymmetric transistor bias is applied in process 72, read disturb process 74 is then performed by the automated test equipment, upon the cells under test. The particular nature of the disturb cycle or cycles applied in process 74 may vary, depending on the expected read stability vulnerability mechanism. Typically, it is contemplated that process 74 will include an access (read or write) to a cell 30 that is in the same row as each cell 30 under test, to ensure that pass transistor 35a is turned on for the cells 30 under test (i.e., cell 30 is "half-selected"). As discussed above, a typical stability failure is caused by the inability of the "on" state driver transistor 34a to maintain a low level at storage node SNT, for the "0" data state case, if pass transistor 35a is turned on so as to couple storage node SNT to the precharged bit line BLT$_k$. Other disturb operations may additionally or instead be included within process 72, including a read of each cell under test itself, a write of an opposite data state to a cell 30 in the same column as each cell under test, or the like. Those skilled in the art having reference to this specification will readily identify those disturb conditions suitable for inclusion within process 74.

Following read disturb process 74, normal and symmetric bias is then applied to all transistors of cells 30 under test, in process 76. Cells 30 under test are then read in process 77, to determine whether the read disturb of process 74 under the reduced bias of process 72 caused loss of the stored data state (i.e., the "0" data state written in process 70). The addresses of failing cells may be stored by the automated test equipment for use in redundant repair, or alternatively a first failed cell may trigger a "fail" condition for RAM 18 as a whole.

In decision 78, the automated test equipment determines whether both data states have been tested. If not (decision 78 is "no"), a "1" data state is then written into cells 30 under test in process 79, considering that "normal" bias remains applied as a result of process 76. Processes 72, 74, 76, 77 are then repeated for this opposite data state in the manner described above, except that the reduced bias will be applied to driver transistor 34b, load transistor 33a, or both, depending on the particular cell construction. For the example of cell 30$_{jk}$ of FIG. 4a, of course, a higher voltage will be applied at array ground voltage node V$_{SSAb}$ than at array ground voltage node V$_{SSAa}$ in this instance of process 72 for the "1" data state. Following this pass of the test sequence for the "1" data state (decision 78 is "yes"), read stability test sequence 64a is complete.

FIG. 8b illustrates the method for performing read current test sequence 64b as applied to one or more SRAM cells 30, also as part of screen process 64. As discussed above, the effects of PBTI degradation can weaken the read current sourced at the one of driver transistors 34a, 34b holding a low data state at its storage node; conversely, NBTI degradation can cause the opposite load transistor 33a, 33b to apply a reduced gate voltage at the "on" state driver in the opposing inverter, similarly weakening the read current. Read current test sequence 64b screens cells 30 under test for these potential weaknesses in read current.

Test sequence 64b in this example begins with the writing of a known data state (e.g., "0") into each of the SRAM cells 30 under test, in process 80, under normal bias. As before, a read of those SRAM cells 30 may be performed to verify the written data state into these cells. For this "0" data state, load transistor 33b and driver transistor 34a are again the "on" state transistors. In process 82 according to this embodiment of the invention, a reduced bias is applied to either or both of the "on" state transistors, namely load transistor 33b and driver transistor 34a, for each SRAM cell 30 under test. This asymmetric bias applied in process 82 is essentially the same as described above in connection with process 72 of FIG. 8a, and as such the particular transistor receiving the reduced bias depends on the construction of SRAM cell 30, according to the examples described above relative to FIGS. 4a, 5a and 6.

Under this reduced transistor bias as applied in process 82, each of cells 30 under test is read by the automated test equipment in process 84. The reduction in transistor bias serves to mimic the effect of threshold voltage degradation due to BTI, as that reduced bias weakens the transistor drive. The read of process 84 thus tests the read current under the reduced bias (e.g., a raised voltage at the source of driver transistor 34a applied by array ground voltage node V$_{SSAa}$), thus determining whether that read current is sufficient to convey the correct "0" data state.

Following the read of process 84, the automated test equipment determines whether both data states have been tested in decision 85. If not (decision 85 is "no"), normal symmetric bias is then applied to all transistors of cells 30 under test in process 86, and the opposite "1" data state is written into cells 30 under test in process 87. Processes 82, 84, 85 are then repeated for this opposite data state in the manner described above, except that the reduced bias will be applied to driver transistor 34b, load transistor 33a, or both, depending on the particular cell construction. Following this pass of the test sequence for the "1" data state (decision 85 is "yes"), read test sequence 64b is complete. The addresses of any failing cells 30 are stored for use in redundant repair, or alternatively RAM 18 is considered as "failed" if failing cells were detected.

Figure 8C:
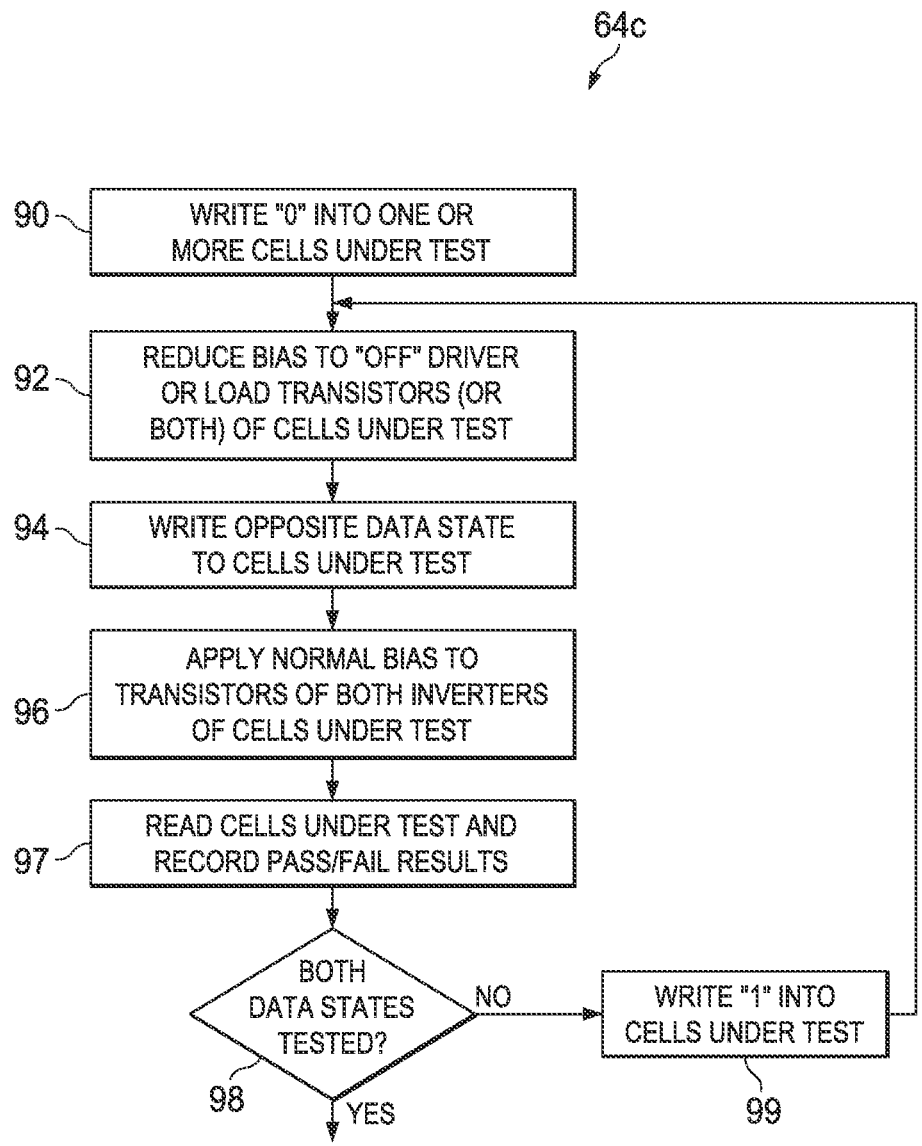

FIG. 8c illustrates a method for performing writeability test sequence 64c as may be included within screen process 64, according to embodiments of this invention. This test sequence 64c in this example begins with the writing of the "0" data state into each of the SRAM cells 30 under test, in process 90. As before, for this "0" data state, load transistor 33b and driver transistor 34a are again the "on" state transistors.

As discussed above, write failures are commonly due to weakness in a pass transistor 35a, 35b to allow the low-side bit line to overcome the drive of its associated load transistor in pulling its storage node from high to low, and in weakness in the associated driver transistor 34a, 34b to responding to feedback to change the cell state, both due to PBTI in the cell construction described above. NBTI degradation at a load transistor 33a, 33b can also cause a write failure, as weaker drive current will degrade its ability to pull a storage node from low to high in response to the write. As such, write screen process 64c will reduce the bias voltage to "off" state transistors, namely either or both of driver transistor 34b and load transistor 33a, which will also affect pass transistor 35b at storage node SNB (which is at a high level for this "0" state).

In process 92 according to this embodiment of the invention, therefore, BTI threshold shift is mimicked by the application of a reduced bias to either or both of the "off" state transistors, namely driver transistor 34b and load transistor 33a, for each SRAM cell 30 currently under test. This asymmetric bias applied in process 92 is essentially the same as described above in connection with processes 72, 82, but is applied to the opposite transistor or transistors from those screen processes 64a, 64b, and will depend on the construction of SRAM cell 30, according to the examples described above relative to FIGS. 4a, 5a and 6. For the example of cell $30_{jk}$ of FIG. 4a, a higher voltage will be applied at array ground voltage node $V_{SSAb}$ than at array ground voltage node $V_{SSAa}$ in process 92; for example, this voltage differential can be on the order of 10% of the nominal bias voltage for the inverters of cell 30 (e.g., 100 mV for nominal array power supply voltage $V_{DDA}$ of 1.2 volts above normal ground voltage $V_{gnd}$).

The automated test equipment then performs a write of the opposite ("1") data state to cells 30 under test in process 94, under the reduced transistor bias applied in process 92 that mimics threshold voltage degradation due to BTI. This write operation of process 94 thus tests the ability of pass transistor 35b and driver transistor 34b, or load transistor 33a (or all those transistors) to successfully change the state of cell 30 under test at the reduced drive current caused by the reduced bias (e.g., a raised voltage at the source of driver transistor 34b applied by array ground voltage node $V_{SSAb}$). Following write process 94, normal symmetric bias is then applied to all transistors of cells 30 under test, in process 96, and cells 30 under test are then read in process 97 to determine whether the write of process 94 under the reduced bias of process 92 was successful. The addresses of failing cells may be stored by the automated test equipment for use in redundant repair, or alternatively a first failed cell may trigger a "fail" condition for RAM 18 as a whole.

In decision 98, the automated test equipment determines whether both data states have been tested. If not (decision 98 is "no"), a "1" data state is then written into cells 30 under test in process 99, and processes 92, 94, 96, 97 are then repeated for this opposite data state as described above. Of course, the asymmetric bias applied in process 92 will be reversed for this data state, to evaluate operation should the other transistors be weakened. Following this pass of the write test sequence 64c for the "1" data state (decision 98 is "yes"), write test sequence 64c is complete. The addresses of any failing cells 30 are stored for use in redundant repair, or alternatively RAM 18 is considered as "failed" if failing cells were detected.

Figure 8D:
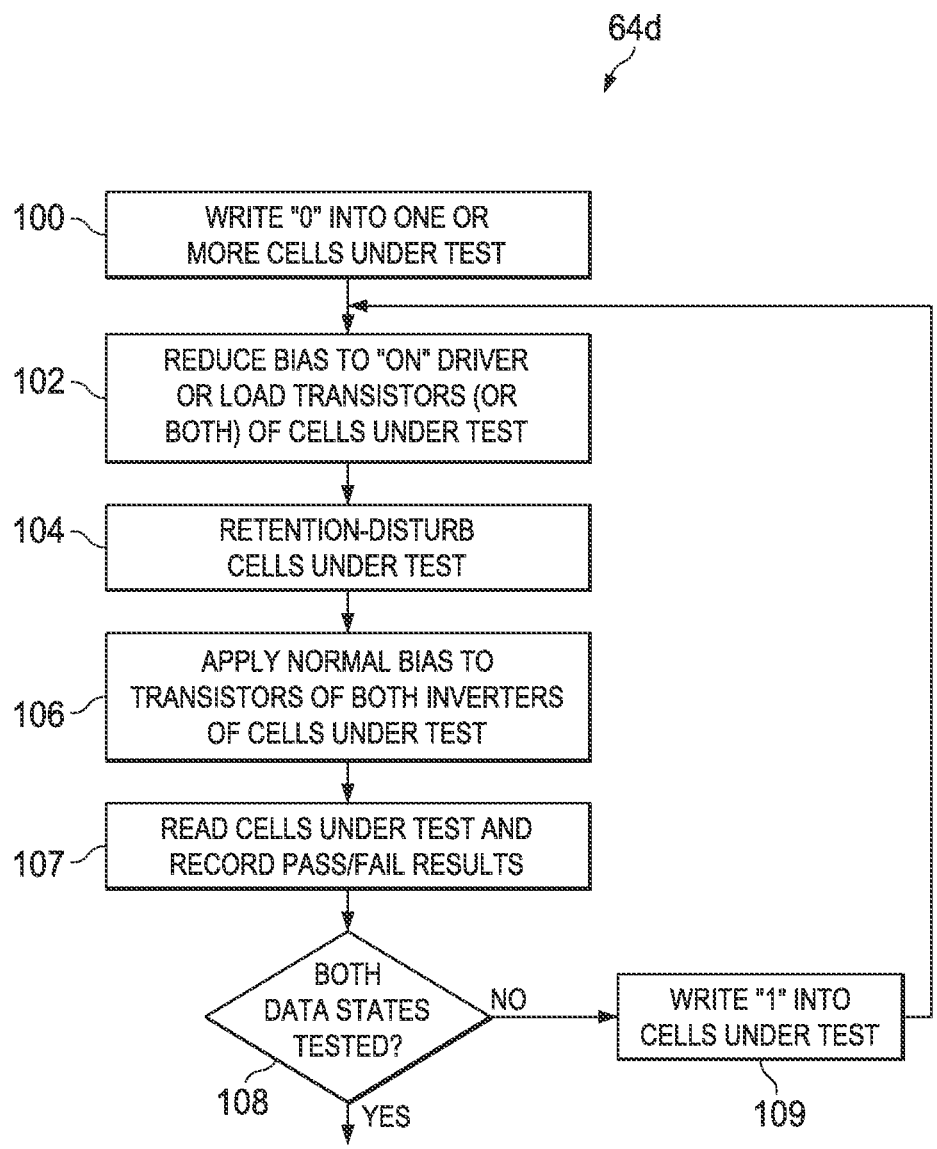

FIG. 8d illustrates a method for performing retention-disturb test sequence 64d as may also be included within screen process 64, according to embodiments of this invention. In process 100, the automated test equipment writes a known data state (e.g., "0") into each of the SRAM cells 30 under test, under normal bias, followed by a read (if desired) to verify the data states written.

In process 102, a reduced bias is applied to either or both of the "on" state transistors, namely load transistor 33b and driver transistor 34a for a "0" data state, in each SRAM cell 30 currently under test. As described above, for the example of cell $30_{jk}$ of FIG. 4a, a higher voltage is applied at array ground voltage node $V_{SSAa}$ than at array ground voltage node $V_{SSAb}$ in process 102, for example a voltage on the order of 10% of the nominal inverter bias voltage (i.e., about 100 mV above array ground voltage $V_{gnd}$ at a nominal array power supply voltage of 1.2 V). Also in process 102, array power supply voltage $V_{DDA}$ may be set at its minimum specification level (e.g., 1.0 volts), if a more stringent screen is desired. The result of process 102 is to mimic the effect of PBTI degradation at the "on" drive transistor (driver transistor 34a for a "0" data state), by way of weakening its drive by reducing its gate-to-source and drain-to-source voltages relative to that of opposing driver transistor 34b.

Following application of the reduced transistor bias in process 102, retention disturb process 104 is then performed by the automated test equipment on the cells under test. According to this embodiment of the invention, in which the reduced bias of process 102 consists of a higher ground level voltage applied to the source of one of driver transistors 34a, 34b, retention disturb process 104 is performed by the automated test equipment reducing the array power supply voltage $V_{DDA}$ to the desired level. For example, a typical retention disturb involves applying ½ the nominal power supply voltage $V_{DDA}$ (e.g., 0.6 V where the nominal power supply voltage is 1.2 V). Cells 30 under test are then statically held at this reduced power supply voltage, for example for a duration of on the order of 100 msec, following which the power supply voltage is returned to those cells.

In the case of cells $30'_{jk}$ and $30''_{jk}$, the asymmetric bias applied in process 102 and retention disturb process 104 may be performed simultaneously, insofar as retention disturb process 104 involves the reduction of array power supply voltage. For example, asymmetric bias may be applied (for the "0" data state) by reducing the voltages at both array power supply nodes $V_{DDAa}$, $V_{DDAb}$, but with the voltage at array power supply node $V_{DDAb}$ being reduced more than the voltage at array power supply voltage node $V_{DDAa}$. This operation would reduce the bias for the "on" state load transistor 33b (for the "0" data state), and also reduce the array power supply voltage generally to carry out the retention disturb.

After retention disturb process 104, normal (symmetric) bias is then applied to all transistors of cells 30 under test in process 106. In process 107, cells 30 under test are then read to determine whether the retention disturb of process 104 under the asymmetric bias applied in process 102 caused loss of the stored data state (i.e., the "0" data state written in process 100). The pass/fail results, including the addresses of failing cells, are stored by the automated test equipment in its memory, also in process 107.

In decision 108, the automated test equipment determines whether both data states have been tested. If not (decision 108 is "no"), a "1" data state is then written into cells 30 under test in process 109, under the "normal" bias conditions applied in process 106. Processes 102, 104, 106, 107 are then repeated for this opposite data state in the manner described above, except that the reduced bias will be applied to driver transistor 34b, load transistor 33a, or both, depending on the particular cell construction. For the example of cell $30_{jk}$ of FIG. 4a, of course, a higher voltage will be applied at array ground voltage node $V_{SSAb}$ than at array ground voltage node $V_{SSAa}$ in the repeated instance of process 102 for the "1" data state. Following this pass of the test sequence for the "1" data state (decision 108 is "yes"), retention stability test sequence 64d is complete.

Referring back to FIG. 7, upon completion of asymmetric bias screen process 64, the remainder of the test program is then completed by the automated test equipment for RAM 18. In this embodiment of the invention, if RAM 18 includes redundant rows or columns (or both) of SRAM cells 30 that are available to replace main array cells that fail screen 64, redundant replacement of any identified failed cells can be performed in the manner shown in FIG. 7. The automated test equipment determines, in decision 65, whether any SRAM cells 30 failed screens 64 by interrogating its memory for any stored addresses of failed cells; if there are none (decision 65 is "pass"), memory array 20 is considered as having passed and is ready for further manufacture. If one or more SRAM cells 30 failed screen 64 than can be replaced by the available redundant cells (decision 465 is "≥n fail"), memory array 20 is considered to have failed, and is disposed of or otherwise reworked as appropriate. If one or more, but fewer than the limit of, SRAM cells 30 failed screen 64, conventional redundant replacement and mapping of redundant cells is performed in process 66, and those newly enabled cells 30 may themselves be screened by screen 64 to ensure their ability to withstand BTI degradation over the expected operating life. Assuming that additional vulnerable bits are not identified (decision 67 is "pass"), memory array 20 is then ready for additional manufacture.

Following the test method shown in FIG. 7, and such other test and wafer-level processing as appropriate, integrated circuit 10 will proceed to the desired packaging and additional test stages of the manufacturing process. In the packaging of integrated circuit 10, it is contemplated that the pads available at the wafer level may enable the hard-wiring of the separate array power supply voltage nodes $V_{DDAa}$, $V_{DDAb}$ and array ground voltage nodes $V_{SSAa}$, $V_{SSAb}$ to one another so that operation of RAM 18 in its system application will be carried out under normal bias conditions.

Embodiments of this invention provide numerous important benefits and advantages over conventional memory test approaches. As described above, the ability to apply asymmetric bias voltage to transistors within memory cells enables the more direct screening of vulnerable cells than is conventionally available by way of conventional "proxy" bias voltages and other test vector conditions. As such, more direct and more robust screening for later life threshold voltage shifts, including both n-channel transistors due to PBTI and p-channel transistors due to NBTI, as well as for variations of operating temperature, is thus provided by embodiments of this invention.

While this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An integrated circuit comprising a solid state memory, the memory comprising:
an array of solid-state memory cells arranged in rows and columns, each row of memory cells associated with a word line and each column of memory cells associated with a bit line, each memory cell comprising:
 a first inverter, comprising:
  a first p-channel load transistor having a gate, and having a source/drain path; and
  a first n-channel driver transistor having a gate connected to the gate of the first load transistor, and having a source/drain path connected to the source/drain path of the first load transistor at a first storage node, the source/drain paths of the first load transistor and the first driver transistor connected in series between a first array power supply node and an array ground node;
 a second inverter, comprising:
  a second p-channel load transistor having a gate, and having a source/drain path; and
  a second n-channel driver transistor having a gate connected to the gate of the second load transistor and to the first storage node, and having a source/drain path connected to the source/drain paths of the second load transistor at a second storage node, the second storage node being connected to the gates of the first load transistor and the first driver transistor, and the source/drain paths of the second load transistor and the second driver transistor connected in series between a second array power supply node and the array ground node; and
 a first pass transistor having a source/drain path connected between the first storage node and a first bit line associated with a column of memory cells containing the memory cell, and having a gate connected to a word line associated with a row of memory cells containing the memory cell;
a first power supply conductor extending over the array and connected to the first array power supply node of each of a first plurality of memory cells;
a second power supply conductor extending over the array and connected to the second array power supply node of each of a first plurality of memory cells;
a first ground conductor extending over the array and connected to the array ground node of each of the first plurality of memory cells; and
peripheral circuitry, coupled to the word lines and bit lines, for selecting one or more cells in the array for read and write access during normal memory operation.

2. The integrated circuit of claim 1, wherein the first plurality of memory cells corresponds to a column of memory cells in the array.

3. The integrated circuit of claim 1, wherein each memory cell further comprises:
a second pass transistor having a source/drain path connected between the second storage node and a second bit line associated with the column of memory cells containing the memory cell, and having a gate connected to the word line.

4. The integrated circuit of claim 1, wherein the first power supply conductor is also connected to the first array power supply node of each of a second plurality of memory cells adjacent in the array to the first plurality of memory cells;
and wherein the second power supply conductor is also connected to the second array power supply node of each of a third plurality of memory cells adjacent in the array to the first plurality of memory cells.

5. The integrated circuit of claim 4, wherein each of the first, second, and third pluralities of memory cells corresponds to a column of memory cells in the array.

6. The integrated circuit of claim 1, further comprising:
power supply voltage select circuitry at a location in the integrated circuit outside of the array, the power supply voltage select circuitry comprising:
first and second switches, for selectively coupling the first power supply conductor to a device array power supply voltage node or to a screen array power supply voltage node responsive to a select signal;
third and fourth switches, for selectively coupling the second power supply conductor to the device array power supply voltage node or to the screen array power supply voltage node responsive to a select signal; and
an equalization switch for coupling the first and second power supply conductors together responsive to an equalize control signal.

7. The integrated circuit of claim 1, wherein the source/drain paths of the first load transistor and the first driver transistor are connected in series between the first array power supply node and a first array ground node;
wherein the source/drain paths of the second load transistor and the second driver transistor are connected in series between a second array power supply node and a second array ground node;
and further comprising:
a second ground conductor extending over the array and connected to the second array ground node of each of the first plurality of memory cells.

8. An integrated circuit comprising a solid state memory, the memory comprising:
an array of solid-state memory cells arranged in rows and columns, each row of memory cells associated with a word line and each column of memory cells associated with a bit line, each memory cell comprising:
a first inverter, comprising:
a first p-channel load transistor having a gate, and having a source/drain path; and
a first n-channel driver transistor having a gate connected to the gate of the first load transistor, and having a source/drain path connected to the source/drain path of the first load transistor at a first storage node, the source/drain paths of the first load transistor and the first driver transistor connected in series between a first array power supply node and a first array ground node;
a second inverter, comprising:
a second p-channel load transistor having a gate, and having a source/drain path; and
a second n-channel driver transistor having a gate connected to the gate of the second load transistor and to the first storage node, and having a source/drain path connected to the source/drain paths of the second load transistor at a second storage node, the second storage node being connected to the gates of the first load transistor and the first driver transistor, and the source/drain paths of the second load transistor and the second driver transistor connected in series between a second array power supply node and a second array ground node; and
a first pass transistor having a source/drain path connected between the first storage node and a first bit line associated with a column of memory cells containing the memory cell, and having a gate connected to a word line associated with a row of memory cells containing the memory cell;
a first power supply conductor extending over the array and connected to the first array power supply node of each of a first plurality of memory cells;
a second power supply conductor extending over the array and connected to the second array power supply node of each of a first plurality of memory cells;
a first ground conductor extending over the array and connected to the first array ground node of each of the first plurality of memory cells;
a second ground conductor extending over the array and connected to the second array ground node of each of the first plurality of memory cells; and
peripheral circuitry, coupled to the word lines and bit lines, for selecting one or more cells in the array for read and write access during normal memory operation.

9. The integrated circuit of claim 8, wherein the first plurality of memory cells corresponds to a column of memory cells in the array.

10. The integrated circuit of claim 8, wherein each memory cell further comprises:
a second pass transistor having a source/drain path connected between the second storage node and a second bit line associated with the column of memory cells containing the memory cell, and having a gate connected to the word line.

11. The integrated circuit of claim 8, wherein the first power supply conductor is also connected to the first array power supply node of each of a second plurality of memory cells adjacent in the array to the first plurality of memory cells;
and wherein the second power supply conductor is also connected to the second array power supply node of each of a third plurality of memory cells adjacent in the array to the first plurality of memory cells.

12. The integrated circuit of claim 11, wherein each of the first, second, and third pluralities of memory cells corresponds to a column of memory cells in the array.

* * * * *